US010591515B2

(12) United States Patent
Rodriguez et al.

(10) Patent No.: US 10,591,515 B2
(45) Date of Patent: Mar. 17, 2020

(54) NON-CONTACT CURRENT MEASUREMENT SYSTEM

(71) Applicant: Fluke Corporation, Everett, WA (US)

(72) Inventors: Ricardo Rodriguez, Mill Creek, WA (US); David L. Epperson, Everett, WA (US); Ronald Steuer, Hinterbruhl (AT); Jeffrey Worones, Seattle, WA (US)

(73) Assignee: Fluke Corporation, Everett, WA (US)

( * ) Notice: Subject to any disclaimer, the term of this patent is extended or adjusted under 35 U.S.C. 154(b) by 359 days.

(21) Appl. No.: 15/604,320

(22) Filed: May 24, 2017

(65) Prior Publication Data

US 2018/0136260 A1    May 17, 2018

Related U.S. Application Data

(60) Provisional application No. 62/421,124, filed on Nov. 11, 2016.

(51) Int. Cl.
*G01R 19/00* (2006.01)
*G01R 33/00* (2006.01)
(Continued)

(52) U.S. Cl.
CPC ............. *G01R 15/207* (2013.01); *G01R 1/22* (2013.01); *G01R 15/146* (2013.01);
(Continued)

(58) Field of Classification Search
CPC ........ G01R 1/22; G01R 15/207; G01R 19/00; G01R 15/142; G01B 7/023
See application file for complete search history.

(56) References Cited

U.S. PATENT DOCUMENTS

| 4,709,339 A | 11/1987 | Fernandes |
| 5,473,244 A | 12/1995 | Libove et al. |

(Continued)

FOREIGN PATENT DOCUMENTS

| EP | 1 249 706 B1 | 9/2007 |
| JP | 2006-242855 A | 9/2006 |

(Continued)

OTHER PUBLICATIONS

Hioki, "3258 : Safety HiTESTER," Revised Edition 5, HIOKI E. E. Corporation, Nagano Japan, 2 pages.

(Continued)

*Primary Examiner* — Alesa Allgood
(74) *Attorney, Agent, or Firm* — Seed Intellectual Property Law Group LLP

(57) ABSTRACT

Systems and methods provide a non-contact current measurement system which operates to measure alternating current flowing through an insulated wire without requiring galvanic contact with the insulated wire. The measurement system may include a magnetic field sensor that is selectively positionable proximate an insulated wire under test. In operation the magnetic field sensor detects a magnetic field generated by the current flowing in the insulated wire. Using an adjustable clamp assembly, the measurement system provides control over the mechanical positioning of the insulated wire relative to the magnetic field sensor to ensure consistent measurements. The non-contact current measurement system may determine information relating to the physical dimensions (e.g., diameter) of the insulated wire. Using the detected magnetic field, the known mechanical positioning, and the determined information relating to the physical dimensions of the insulated wire, the measurement system accurately determines the magnitude of the current flowing through the insulated wire without galvanic contact.

27 Claims, 20 Drawing Sheets

(51) Int. Cl.
*G01R 15/20* (2006.01)
*G01R 15/14* (2006.01)
*G01R 1/22* (2006.01)

(52) U.S. Cl.
CPC .......... *G01R 15/148* (2013.01); *G01R 19/00* (2013.01); *G01R 19/0092* (2013.01)

(56) References Cited

U.S. PATENT DOCUMENTS

| | | | |
|---|---|---|---|
| 5,583,444 | A | 12/1996 | Nakamura et al. |
| 5,973,501 | A | 10/1999 | Reichard |
| 6,014,027 | A | 1/2000 | Reichard |
| 6,043,640 | A | 3/2000 | Lauby et al. |
| 6,091,237 | A | 7/2000 | Chen |
| 6,118,270 | A | 9/2000 | Singer et al. |
| 6,664,708 | B2 | 12/2003 | Shlimak et al. |
| 6,812,685 | B2 | 11/2004 | Steber et al. |
| 6,825,649 | B2 | 11/2004 | Nakano |
| 7,084,643 | B2 | 8/2006 | Howard et al. |
| 7,466,145 | B2 | 12/2008 | Yanagisawa |
| 8,054,061 | B2 | 11/2011 | Prance et al. |
| 8,222,886 | B2 | 7/2012 | Yanagisawa |
| 8,330,449 | B2 | 12/2012 | Greenberg |
| 8,680,845 | B2 | 3/2014 | Carpenter et al. |
| 8,803,506 | B2 | 8/2014 | Yanagisawa |
| 9,063,184 | B2 | 6/2015 | Carpenter et al. |
| 9,201,100 | B2 | 12/2015 | Yanagisawa |
| 9,575,094 | B2* | 2/2017 | Mitsuya ............... G01R 15/207 |
| 2002/0167303 | A1 | 11/2002 | Nakano |
| 2005/0168724 | A1* | 8/2005 | Studer ................... G01B 7/023 356/72 |
| 2010/0090682 | A1 | 4/2010 | Armstrong |
| 2010/0283539 | A1 | 11/2010 | Yanagisawa |
| 2012/0259565 | A1 | 10/2012 | Oshima et al. |
| 2012/0290240 | A1 | 11/2012 | Fukui |
| 2013/0057273 | A1* | 3/2013 | Ide ....................... G01R 33/093 324/252 |
| 2013/0076343 | A1 | 3/2013 | Carpenter et al. |
| 2013/0147464 | A1* | 6/2013 | Tan ......................... G01R 1/22 324/126 |
| 2014/0035607 | A1 | 2/2014 | Heydron et al. |
| 2014/0062459 | A1 | 3/2014 | El-Essawy et al. |
| 2014/0103905 | A1* | 4/2014 | Johnson ............... G01R 15/181 324/127 |
| 2015/0002138 | A1 | 1/2015 | Fox |
| 2015/0042320 | A1 | 2/2015 | Cadugan et al. |
| 2016/0047846 | A1 | 2/2016 | Sharma et al. |
| 2016/0054251 | A1* | 2/2016 | Deschler .............. H02G 1/1248 81/9.51 |
| 2016/0109486 | A1 | 4/2016 | Yanagisawa |
| 2017/0189122 | A1* | 7/2017 | Gliner ..................... G01B 7/12 |

FOREIGN PATENT DOCUMENTS

| | | |
|---|---|---|
| JP | 2007-163414 A | 6/2007 |
| JP | 2007-163415 A | 6/2007 |
| JP | 2007-212204 A | 8/2007 |
| JP | 2007-256141 A | 10/2007 |
| JP | 2008-2925 A | 1/2008 |
| JP | 2008-14644 A | 1/2008 |
| JP | 2008-14645 A | 1/2008 |
| JP | 2008-20270 A | 1/2008 |
| JP | 2008-215900 A | 9/2008 |
| JP | 2008-261646 A | 10/2008 |
| JP | 2008-261783 A | 10/2008 |
| JP | 2008-261785 A | 10/2008 |
| JP | 2009-168696 A | 7/2009 |
| JP | 2010-25778 A | 2/2010 |
| JP | 2010-286347 A | 12/2010 |
| JP | 2011-122860 A | 6/2011 |
| JP | 2012-47677 A | 3/2012 |
| JP | 2014-44168 A | 3/2014 |
| JP | 2014-44169 A | 3/2014 |
| JP | 2014-106220 A | 6/2014 |
| JP | 2016-3997 A | 1/2016 |

OTHER PUBLICATIONS

Mitchell Instrument Company Inc., clipping from the Mitchell Catalogue, undated, 1 page.

Takahashi, "Clamp On Power Logger PW3365 : Safety Voltage Sensor PW9020," *HIOKI Technical Notes* 1(1): 2015, 8 pages.

Tsang et al., "Dual capacitive sensors for non-contact AC voltage measurement," *Sensors and Actuators A* 167:261-266, 2011.

* cited by examiner

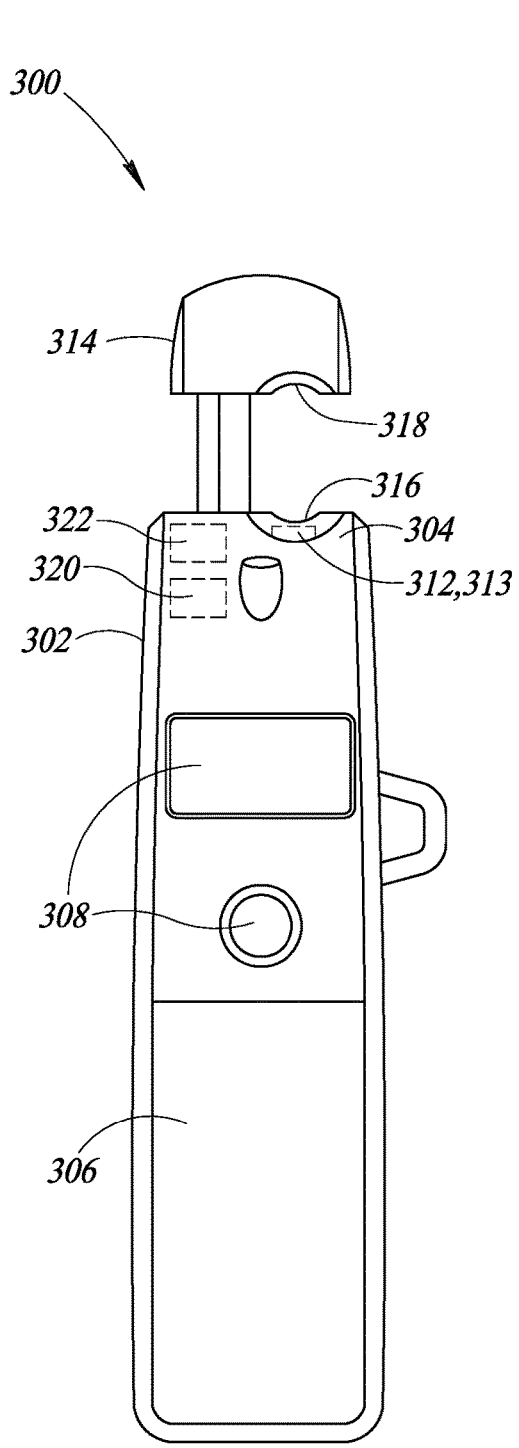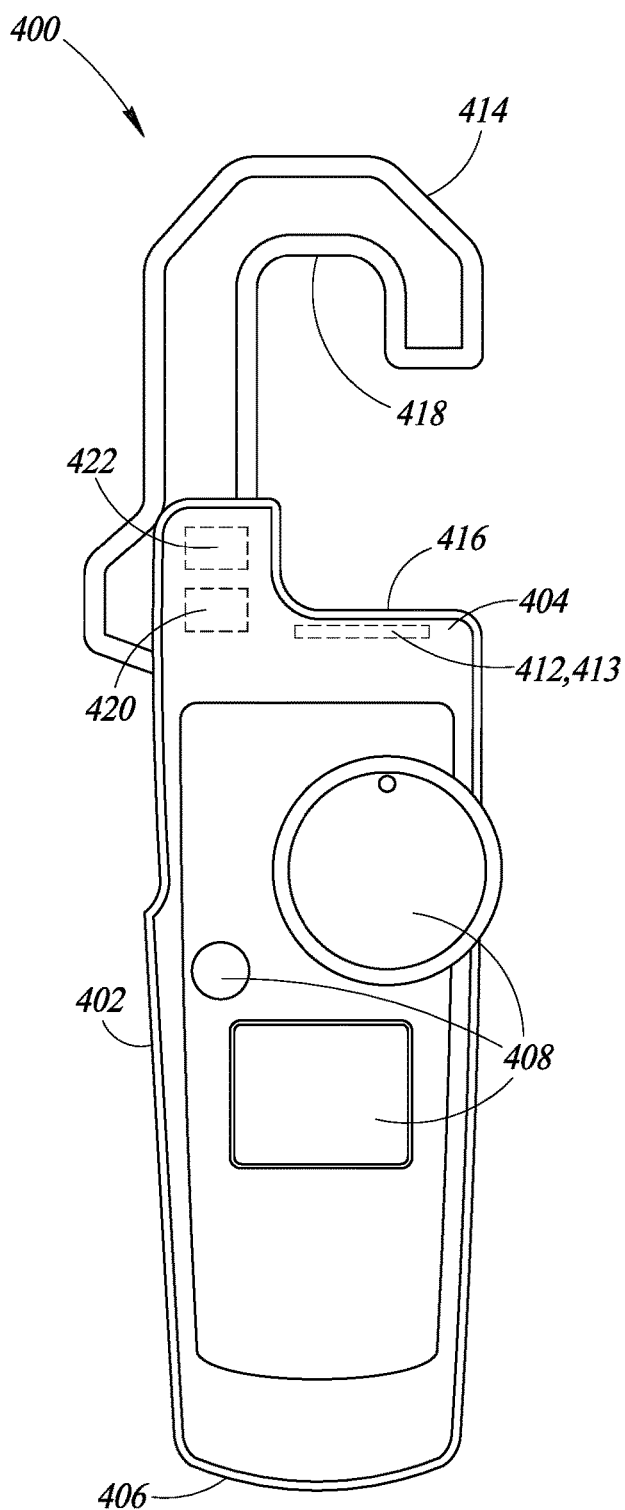
FIG. 3
FIG. 4

NON-CONTACT CURRENT MEASUREMENT SYSTEM

BACKGROUND

Technical Field

The present disclosure generally relates to measurement of electrical characteristics, and more particularly, to non-contact measurement of alternating current (AC) in electrical circuits.

Description of the Related Art

Ammeters are instruments used for measuring current in an electric circuit. Instruments which measure more than one electrical characteristic are referred to as multimeters or digital multimeters (DMMs), and operate to measure a number of parameters generally needed for service, troubleshooting, and maintenance applications. Such parameters typically include alternating current (AC) voltage and current, direct current (DC) voltage and current, and resistance or continuity. Other parameters, such as power characteristics, frequency, capacitance, and temperature, may also be measured to meet the requirements of the particular application.

In order to measure current with a general purpose multimeter, an internal current shunt having a known resistance must be inserted in the current path, requiring a break in the current-carrying conductor. The voltage drop across the current shunt is then measured to determine the current in the current path. General purpose multimeters employing internal current shunts are generally limited to a few amperes maximum because of the capacity of the multimeter test leads and circuitry to carry the current. Furthermore, the multimeter generally must be protected with an internal fuse to prevent excessive current levels from flowing through the multimeter, both for safety reasons and to prevent damage to the multimeter.

With conventional ammeters or multimeters which measure AC current, it may be necessary to bring at least one measurement electrode or probe into galvanic contact with a conductor, which often requires breaking a circuit and/or cutting away part of the insulation of an insulated electrical wire, or providing a terminal for measurement in advance. Besides requiring an exposed wire or terminal for galvanic contact, the step of touching probes to stripped wires or terminals can be relatively dangerous due to the risks of shock or electrocution.

BRIEF SUMMARY

A non-contact current measurement system may be summarized as including: an adjustable clamp assembly which selectively clamps an insulated wire and may locate the wire in a defined position; a position feedback sensor that, in operation, generates a position feedback sensor signal indicative of a diameter of the insulated wire clamped in the adjustable clamp assembly; a magnetic field sensor positioned proximate the adjustable clamp assembly, wherein in operation the magnetic field sensor generates a magnetic field sensor signal that is indicative of at least one characteristic of a current flowing through the insulated wire clamped in the adjustable clamp assembly; and at least one processor communicatively coupled to the position feedback sensor and the magnetic field sensor, wherein in operation the at least one processor: receives the position feedback sensor signal from the position feedback sensor; receives the magnetic field sensor signal from the magnetic field sensor; and determines at least one characteristic of the current flowing through the insulated wire based at least in part on the received position feedback sensor signal and the magnetic field sensor signal.

The adjustable clamp assembly may include a first clamp surface and a second clamp surface, the second clamp surface may face the first clamp surface, and at least one of the first and second clamp surfaces (e.g., "jaws") may be movable in a direction toward and away from the other of the first and second clamp surfaces to selectively clamp the insulated wire between the first and second clamp surfaces at a defined location. The first clamp surface may include a front end surface of a front end of a housing of the non-contact current measurement system, and the second clamp surface may be disposed on a clamp member that is selectively movable with respect to front end surface. The magnetic field sensor may be positioned proximate the front end surface of the front end of the housing. The adjustable clamp assembly may include a slider clamp assembly, and the position feedback sensor may include a linear position feedback sensor that generates a position feedback signal indicative of a linear position of the slider clamp assembly. The adjustable clamp assembly may include a first clamp portion having a first clamp surface and a second clamp portion having a second clamp surface that faces the first clamp surface, and a biasing member may bias the first clamp portion toward the second clamp portion. The non-contact current measurement system may further include a user interface operatively coupled to the at least one processor, wherein in operation the at least one processor causes the user interface to display the determined at least one characteristic of the current flowing through the insulated wire. The at least one characteristic of the current flowing through the insulated wire may include a magnitude of the current flowing through the insulated wire. The position feedback sensor may include a resistive sensor, a magneto-resistive sensor, a Hall Effect sensor, or an optical sensor. The non-contact current measurement system may further include: a voltage reference signal type sensor that, in operation, senses a reference signal in the insulated wire without galvanically contacting the insulated wire, wherein the at least one processor receives the reference signal and determines the at least one characteristic of the current flowing through the insulated wire driven by a reference voltage based at least in part on the received reference signal. The at least one processor may further determine at least one physical dimension of a conductor inside the insulated wire based at least in part on the received reference signal. The at least one processor may further determine at least one physical dimension of a conductor inside the insulated wire based at least in part on the received reference signal and the received position feedback sensor signal, which provides the outer diameter of the conductor of the insulated wire.

A method of measuring current in an insulated wire without galvanically contacting a conductor in the insulated wire may be summarized as including: clamping, via an adjustable clamp assembly, the insulated wire between first and second clamp surfaces; determining a clamp distance between the first and second clamp surfaces, wherein the clamp distance is indicative of a diameter of the insulated wire clamped between the first and second clamp surfaces; sensing, via a magnetic field sensor positioned proximate the insulated wire clamped between the first and second clamp surfaces, a magnetic field generated by the current flowing through the insulated wire; and determining, via at least one processor, at least one characteristic of the current flowing through the insulated wire based at least in part on the determined clamp distance and the sensed magnetic field generated by the current flowing through the insulated wire.

The first clamp surface may include a front end surface of a front end of a housing and the second clamp surface may include a surface of a clamp member of the adjustable clamp assembly that is movable with respect to the front end surface, and clamping the insulated wire between the first and second clamp surfaces may include clamping the insulated wire between the front end surface and the surface of the clamp member. Sensing the magnetic field generated by the current flowing through the insulated wire may include sensing the magnetic field via the magnetic field sensor, and the magnetic field sensor may be positioned proximate the front end surface of the front end of the housing. Clamping the insulated wire between the first and second clamp surfaces may include clamping the insulated wire between first and second clamp surfaces of a slider clamp assembly, and determining the clamp distance may include determining a linear position of the slider clamp assembly. Any other clamping mechanism in addition to a slider may also be used to provide the position. One other example is a clothespin type of clamping where the wire diameter is proportional the opening angle of the rotary clamping. The first clamp surface may be positioned on a first clamp portion and the second clamp surface may be positioned on a second clamp portion, and the method may further include biasing the first clamp portion toward the second clamp portion. The method may further include: displaying, via a user interface, the determined at least one characteristic of the current flowing through the insulated wire. Determining the at least one characteristic of the current flowing through the insulated wire may include determining a magnitude of the current flowing through the insulated wire. The method of claim may further include: sensing, via a reference signal type sensor positioned in a housing, a reference signal in the insulated wire without galvanically contacting the insulated wire; and determining, via the at least one processor, the at least one characteristic of the current flowing through the insulated wire based at least in part on the sensed reference signal. The method may further include, via the at least one processor, at least one physical dimension of a conductor inside the insulated wire based at least in part on the received reference signal. The method may further include, via the at least one processor, at least one physical dimension of a conductor inside the insulated wire based at least in part on the received reference signal and the received position feedback sensor signal. The reference method may also deliver the position of the wire and both methods of mechanical clamping or reference signal can be used individually or together to determine the wire diameter.

A non-contact current measurement system may be summarized as including: a housing including a front end portion having a front end surface; a clamp member having a clamp member surface that faces the front end surface, wherein the clamp member is movable with respect to the front end surface to selectively clamp an insulated wire between the front end surface and the clamp member surface; a position feedback sensor that generates a position feedback sensor signal that is indicative of a position of the clamp member; a current sensor positioned proximate the front end surface of the housing, wherein in operation the current sensor generates a current sensor signal that is indicative of at least one characteristic of a current flowing through the insulated wire clamped between the front end surface and the clamp member surface; and at least one processor communicatively coupled to the position feedback sensor and the current sensor, wherein in operation the at least one processor: receives the position feedback sensor signal from the position feedback sensor; receives the current sensor signal from the current sensor; and determines at least one characteristic of the current flowing through the insulated wire based at least in part on the received position feedback signal and the current sensor signal.

The current sensor may include a magnetic field sensor. The non-contact current measurement system may further include a display operatively coupled to the at least one processor, wherein in operation the at least one processor causes the display to present a magnitude of the current flowing through the insulated wire. The position feedback sensor may include a resistive sensor, a magneto-resistive sensor, a Hall Effect sensor, capacitive sensor, inductive sensor, or an optical sensor.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

FIG. 3 is a front elevational view of another implementation of a non-contact current measurement system, according to one illustrated implementation.

FIG. 4 is a front elevational view of another implementation of a non-contact current measurement system, according to one illustrated implementation.

DETAILED DESCRIPTION

Figure 1:
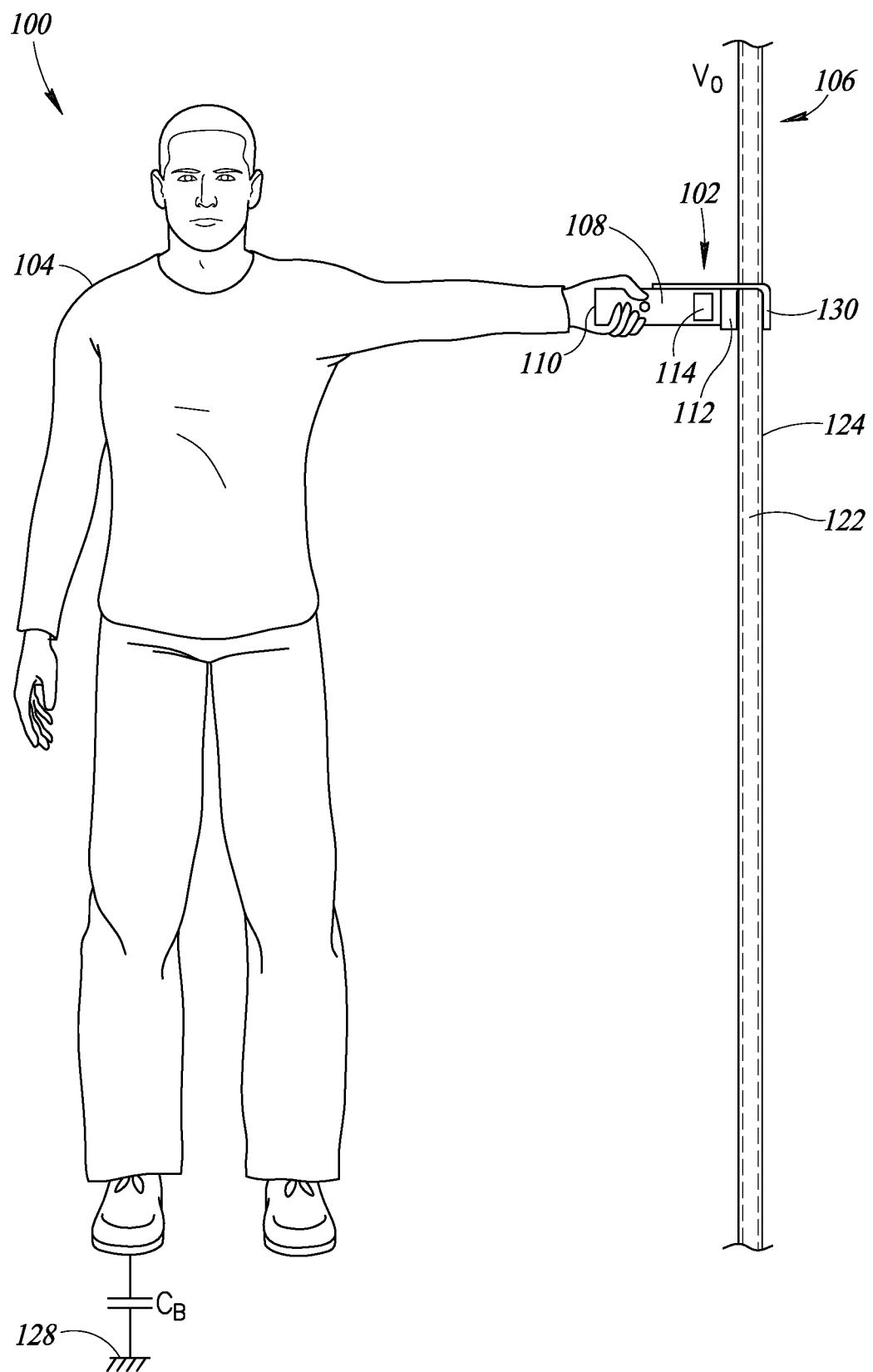
FIG. 1 is a pictorial diagram of an environment in which a non-contact current measurement system may be used by an operator to measure AC current present in an insulated wire without requiring galvanic contact with the insulated wire, according to one illustrated implementation.

Systems and methods disclosed herein provide non-contact current measurement systems that measure current flowing through an insulated wire without requiring galvanic contact with the conductor of the insulated wire. In at least some implementations, a non-contact current measurement system includes a magnetic field sensor that is selectively positionable proximate (e.g., adjacent) an insulated wire under test. Non-limiting examples of magnetic field sensors include anisotropic magnetoresistive (AMR) sensors, giant magnetoresistive (GMR) sensors, fluxgate sensors, squid sensors, fiber-optic sensors, optically pumped sensors, nuclear procession sensors, search-coil sensors, magnetotransistor sensors, magnetodiode sensors, magneto-optical sensors, Hall effect sensors, Rogowski coils, current transformers, or other types of magnetic field sensors. The magnetic field sensor detects a magnetic field generated by the current flowing in the insulated wire. The magnitude of the magnetic field surrounding the conductor of the insulated wire is related (e.g., proportional) to the magnitude of current flowing through the conductor of the insulated wire.

In addition to detecting the magnetic field surrounding a conductor, at least some of the implementations of the present disclosure utilize an adjustable clamp assembly to provide control over the mechanical positioning of the insulated wire relative to the magnetic field sensor. Further, in at least some implementations, the non-contact current measurement system determines information relating to at least one physical dimension of the insulated wire under test, such as its outer diameter or gauge of the conductor inside the insulation of the insulated wire. Using the detected magnetic field, the controlled mechanical positioning, and the determined physical dimension information, the non-contact current measurement system accurately determines the magnitude of the current flowing through the conductor of an insulated wire.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise. In addition, the headings and Abstract of the Disclosure provided herein are for convenience only and do not interpret the scope or meaning of the implementations.

Figure 2A:
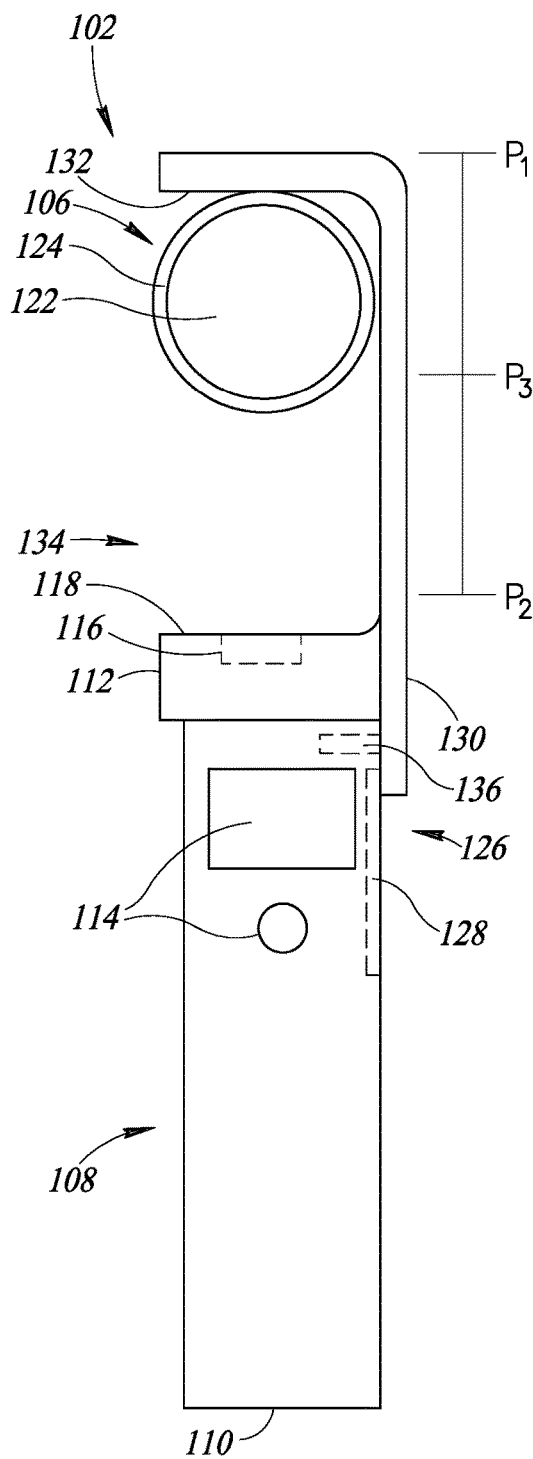
FIG. 2A is a front elevational view of a non-contact current measurement system which includes an adjustable clamp assembly, shown with a clamp member of the adjustable clamp assembly spaced apart from an insulated wire.
Figure 2B:
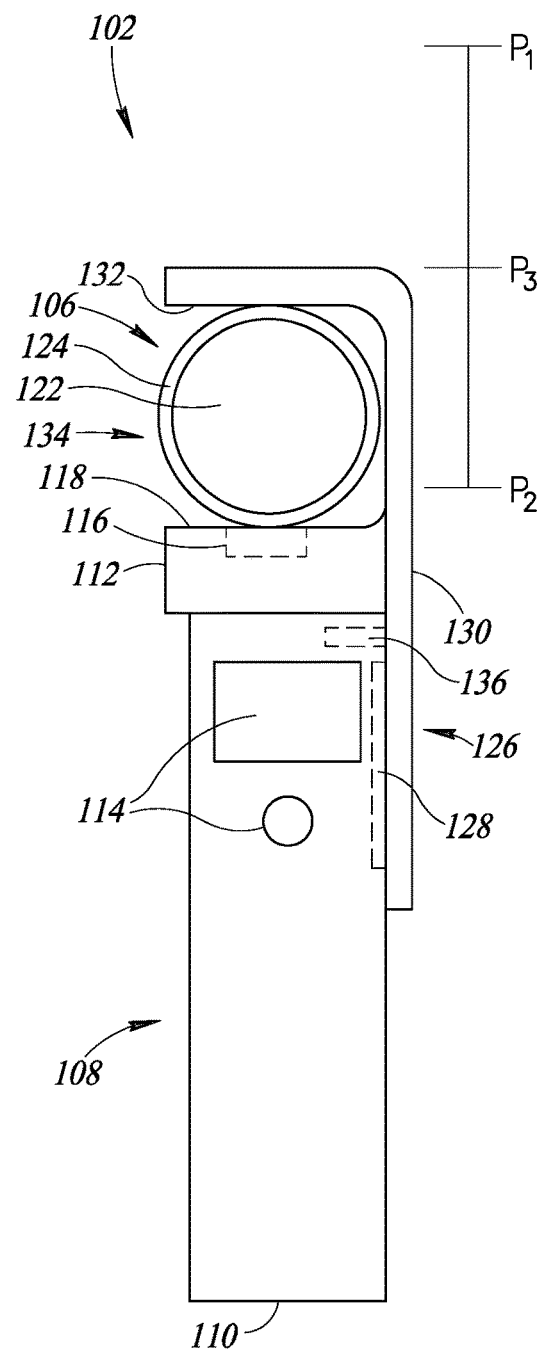
FIG. 2B is a front elevational view of the non-contact current measurement system of FIG. 2A, shown with the insulated wire clamped by the clamp member of the adjustable clamp assembly.

FIG. 1 is a pictorial diagram of an environment 100 in which a non-contact current measurement system 102 may be used by a technician 104 to measure AC current present in an insulated wire 106 without requiring galvanic contact between the non-contact current measurement system and the insulated wire 106. FIGS. 2A and 2B show enlarged views of the non-contact current measurement system 102.

The non-contact current measurement system 102 includes a housing or body 108 which includes a grip portion or end 110 and a front portion or end 112 opposite the grip portion. The housing 108 may also include a user interface 114 which facilitates user interaction with the non-contact current measurement system 102. The user interface 114 may include any number of inputs (e.g., buttons, dials, switches, touch sensor) and any number of outputs (e.g., display, LEDs, speakers, buzzers). The non-contact current measurement system 102 may also include one or more wired and/or wireless communications interfaces (e.g., USB, Wi-Fi®, Bluetooth®).

As shown in FIGS. 2A and 2B, a magnetic field sensor 116 (e.g., anisotropic magnetoresistive (AMR) sensor, giant magnetoresistive (GMR) sensor, fluxgate sensor, etc.) is positioned below a top surface 118 of the front end 112. The magnetic field sensor 116 is used to detect the magnetic field generated by a current flowing in the insulated wire 106, which comprises a conductor 122 surrounded by one or more layers of insulation 124. The magnitude of the magnetic field surrounding the conductor 122 is related (e.g., proportional) to the magnitude of the current flowing through the conductor. Generally, the magnitude of the current flowing in the conductor 122 may be accurately determined by the magnetic field sensor 116 when two parameters are met. The first parameter is control over the mechanical positioning of the insulated wire 106 relative to the magnetic field sensor 116, which is controlled by an adjustable clamp assembly 126 in at least some implementations. The second parameter is physical dimension information of the insulated wire 106, such as its outer diameter or the diameter of the conductor inside the insulation of the insulated wire (i.e., gauge), which may be determined or estimated by a position feedback sensor 128 operatively coupled to the adjustable clamp assembly 126. The adjustable clamp assembly 126 and the position feedback sensor 128 are discussed further below.

Further, in at least some implementations, physical dimension information regarding the gauge of the insulated wire 106 may additionally or alternatively be obtained utilizing one or more reference signal sensors that detect a generated reference signal (e.g., reference current signal) between the sensor and the insulated wire 106. Various example non-contact measurement systems that implement such a "reference signal" method of detecting physical dimension information for an insulated wire are discussed below with reference to FIG. 7A through FIG. 21. For example, in at least some implementations, an adjustable clamp assembly and position feedback sensor may be used to determine the overall diameter of an insulated wire, and the reference signal method may be used to determine the thickness of the insulation of the insulated wire. Using the determined overall diameter of the insulated wire and the determined insulation thickness, the non-contact current measurement system may automatically determine or estimate the diameter of the conductor inside the insulation of the insulated wire (e.g., the diameter of the conductor is equal to the overall diameter of the insulated wire reduced by two times the insulation thickness). The determined diameter of the conductor may then be used in conjunction with the detected magnetic field to accurately determine the magnitude of the current flowing through the insulated wire.

In the illustrated implementation, the mechanical positioning of the insulated wire 106 is provided by the adjustable clamp or "slider" clamp assembly 126 which ensures that the insulated conductor is positioned in proper alignment (e.g., adjacent) with the magnetic field sensor 116 during measurement. The adjustable clamp assembly 126 includes a clamp member 130 coupled to the housing 108 that is selectively movable toward to and away from the top surface 118 of the front end 112. The clamp member 130 may be referred to herein as a first clamp portion, and the front end 112 may be referred to herein as a second clamp portion. The clamp member 130 includes a clamp surface 132 that faces the top surface 118 of the front end 112 and is generally parallel thereto. The clamp surface 132 and the top surface 118 together define a variably-sized clamp opening 134 sized and dimensioned to receive a portion of the insulated wire 106 therein. In the illustrated example, the clamp member 130 is selectively movable between a first position $P_1$, in which the clamp opening 134 is relatively large, and a second position $P_2$, in which the clamp opening is relatively small.

As shown in FIG. 2A, a user may position the insulated wire 106 within the clamp opening 134 when the clamp surface 132 of the clamp member 130 is spaced apart from the top surface 118 of the front end 112 by an amount sufficient to easily allow the insulated wire to be moved into the clamp opening. Then, as shown in FIG. 2B, the user may move the clamp member 130 downward to a third position $P_3$ to "clamp" the insulated wire 106 between the top surface 118 of the front end 112 and the clamp surface 132, such that the top surface and the clamp surface both contact the insulation layer of the insulated wire on opposite sides. As used herein, the term "clamp" is used to refer to the insulated wire 106 being contacted by the top surface 118 and the clamp surface 132 on opposite sides of the insulated wire to maintain the position of the wire relative to the magnetic field sensor 116. That is, the term does not indicate that the top surface 118 or the clamp surface 132 necessarily impart any particular amount of force on the insulated wire 106.

The position feedback sensor 128 is operative to sense the position (e.g., linear position) of the clamp member 130 and generates a position feedback sensor signal (e.g., linear position feedback sensor signal) that is indicative of such. The position feedback signal may be a digital or analog signal, for example. When the insulated wire 106 is clamped between the clamp surface 132 and the top surface 118 of the front end 112, the sensed position of the clamp member 130 may be used to determine or estimate the diameter or gauge of the insulated wire. For example, the position feedback sensor 128 may provide a position feedback sensor signal that is proportional to the extension of the clamp member 130. The position feedback sensor 128 may be any suitable sensor operative to sense the extension of the clamp member 130 and determine the diameter of the insulated wire 106.

For example, the position feedback sensor 128 may include a resistive sensor, a magneto-resistive sensor, a Hall Effect sensor, an optical sensor, etc. As discussed further below, in at least some implementations a "reference signal" method may additionally or alternatively be used to determine the diameter or dimensions of the conductor inside the insulated wire 106, which may further allow the system 102 to provide accurate current measurements.

In at least some implementations, the clamp member 130 may be biased toward the second position $P_2$ by a suitable biasing member 136. For example, the clamp member 130 may be biased toward the second position $P_2$ by a spring coupled between the clamp member and a portion of the housing 108. Advantageously, biasing the clamp member 130 may allow for the clamp assembly 126 to better retain the insulated wire 106 in the clamp opening 134, while also providing more uniform measurements of the diameter of the insulated wire 106.

The mechanical positioning of the insulated wire 106 relative to the magnetic field sensor 116 may be important due to the orthogonal relationship between magnetic flux density and current flow (e.g., the "right hand rule" for magnetic flux around a current-carrying conductor). In addition, the physical dimension information provided by the position feedback sensor 128 may be important due to magnetic flux density, which is tangent to the circumference of the conductor, being higher in conductors with smaller diameters than conductors with larger diameters for the same current flow. Thus, by knowing at least an estimation of the diameter of the insulated wire, the non-contact current measurement system 102 can more accurately determine the current flowing through the insulated wire by accounting for the impact the diameter of the wire has on the relationship between the sensed magnetic field and the current flowing in the wire.

As discussed further below with reference to FIG. 6, using data from the magnetic field sensor 116 and the diameter or gauge data from the position feedback sensor 128 and/or a reference signal sensor, at least one processor of the non-contact current measurement system 102 may accurately determine at least one characteristic (e.g., magnitude, frequency) of the current flowing through the insulated wire 106. Such information may be presented to the user via a display of the user interface 114, stored in a nontransitory processor-readable storage medium of the non-contact current measurement system, and/or transmitted to a separate device by a wired or wireless communications interface.

Although the illustrated non-contact current measurement system 102 includes the magnetic field sensor 116, it is appreciated that in other implementations the non-contact current measurement system may include various other types of magnetic field sensors (e.g., a Hall Effect sensor, a Rogowski coil, a current transformer, etc.) capable of sensing the magnetic field generated by a current without requiring galvanic contact with the wire under test.

As discussed further below, in at least some implementations, the non-contact measurement system 102 may utilize the body capacitance ($C_B$) between the operator 104 and ground 128 during the current measurement. Although the term ground is used for the node 128, the node is not necessarily earth/ground but could be connected in a galvanically isolated manner to any other reference potential by capacitive coupling.

FIG. 3 shows a front elevational view of a non-contact current measurement system 300 that has a different form factor than the non-contact current measurement system 102. The non-contact current measurement system 300 may be similar or identical to the non-contact current measurement system 102 discussed above in many respects. Thus, some or all of the discussion above regarding the features of the non-contact current measurement system 102 may also apply to the non-contact current measurement system 300.

The non-contact current measurement system 300 includes a housing 302 having a front end 304 and a grip portion or end 306 opposite the front end. The housing 302 includes a user interface 308 (e.g., display, buttons) positioned on a surface of the housing. The front end 304 includes a current sensor 312 (e.g., magnetic field sensor), an optional reference signal sensor 313, and a retractable jaw or clamp member 314 for grasping an insulated wire (e.g., insulated wire 106 of FIGS. 1, 2A and 2B). The operation of various reference signal sensors is discussed further below with reference to FIGS. 7A-21. The front end 304 includes a front end surface 316 adjacent the current sensor 312 and the clamp member 314 includes a clamp surface 318 opposite the front end surface 316. For a further increase of current measurement accuracy, a second magnetic field sensor could be used in clamp member 314. The average signal between the current sensor 312 and an additional sensor located in the clamp member 314 can then be used for the current calculation. In addition, the difference between both sensors exceeding a limit can be used to identify unreliable situations caused by external stray currents or an incorrectly positioned wire clamped between the clamp members 314 and 316. In use, an insulated wire may be clamped between the front end surface 316 and the clamp surface 318 to position the insulated wire adjacent the current sensor 312. The clamp member 314, as well as other clamp members of the present disclosure, may be permanently attached to the housing 302 or may be selectively detachable from the housing. The non-contact current measurement system 300 also includes a position feedback sensor 320 and optionally includes a biasing member 322 to bias the clamp member 314 toward the housing 302 to clamp an insulated wire between the front end surface 316 and the clamp surface 318. Further discussion of embodiments of a current sensor and a position feedback sensor suitable for use in the non-contact current measurement system 300 is provided with regard to FIG. 6.

FIG. 4 shows a front elevational view of a non-contact current measurement system 400 that has a different form factor than the non-contact current measurement system 102. The non-contact current measurement system 400 may be similar or identical to the non-contact current measurement systems discussed above in many respects. Thus, some or all of the discussion above regarding the features of the non-contact current measurement systems above may also apply to the non-contact current measurement system 400.

The non-contact current measurement system 400 includes a housing 402 having a front end 404 and a grip portion or end 406 opposite the front end. The housing 402 includes a user interface 408 (e.g., display, buttons, dial) positioned on a surface of the housing. The front end 404 includes a current sensor 412 (e.g., magnetic field sensor), an optional reference signal sensor 413, and a retractable hook or clamp member 414 for grasping an insulated wire (e.g., insulated wire 106 of FIGS. 1, 2A and 2B). The front end 404 includes a front end surface 416 adjacent the current sensor 412 and the clamp member 414 includes a clamp surface 418 opposite the front end surface 416. In use, an insulated wire may be clamped between the front end surface 416 and the clamp surface 418 to position the insulated wire adjacent the current sensor 412. The clamp member 414 may be permanently attached to the housing 402 or may be selectively detachable from the housing. The non-contact current measurement system 400 also includes a position feedback sensor 420 and optionally includes a biasing member 422 to bias the clamp member 414 toward the housing 402 to clamp an insulated wire between the front end surface 416 and the clamp surface 418. Suitable embodiments of a current sensor and position feedback sensor that may be used in the non-contact current measurement system 400 is provided with regard to FIG. 6.

Figure 5:
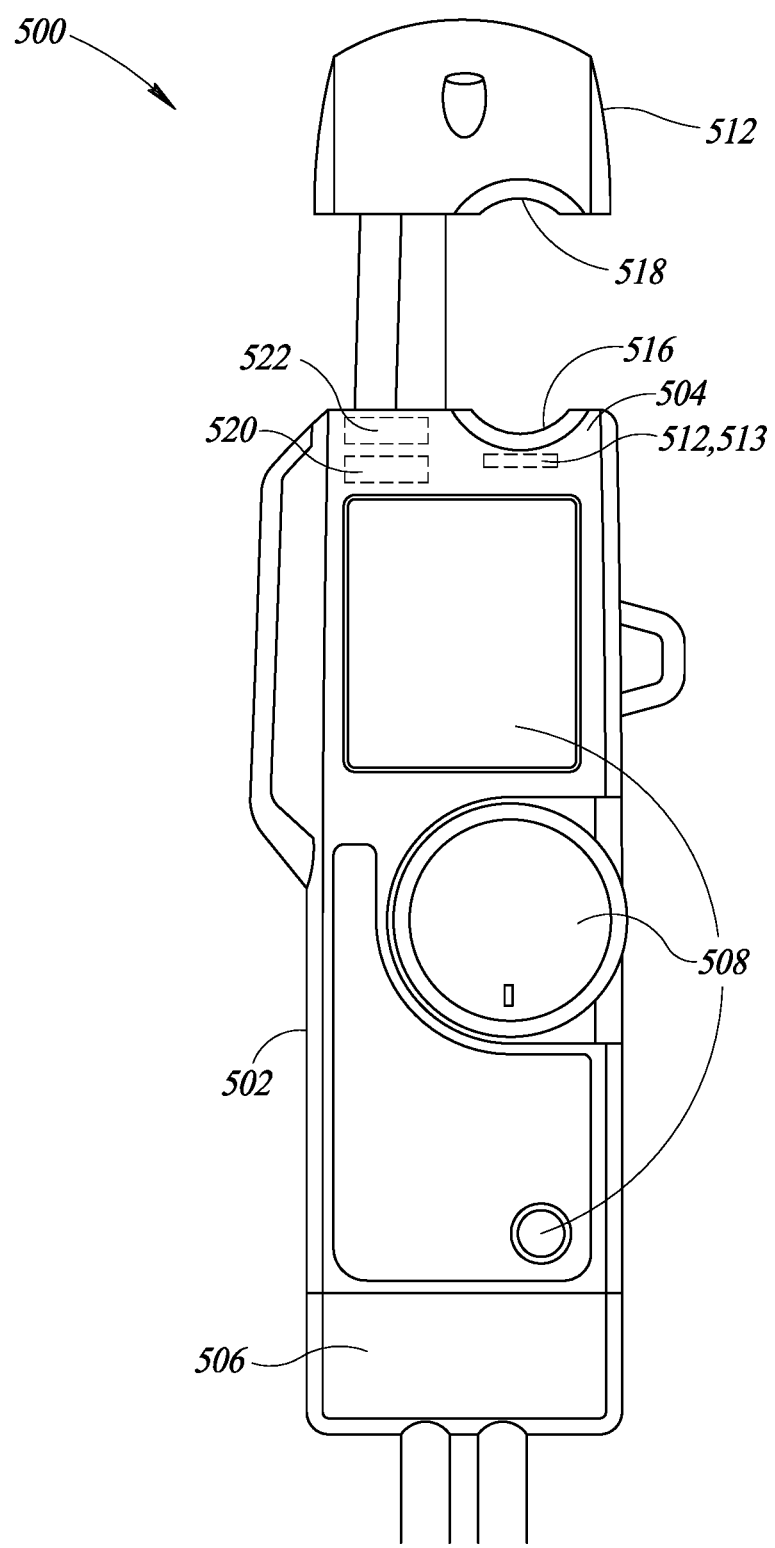
FIG. 5 is a front elevational view of another implementation of a non-contact current measurement system, according to one illustrated implementation.

FIG. 5 shows a front elevational view of a non-contact current measurement system 500 that has a different form factor than the non-contact current measurement system 102. The non-contact current measurement system 500 may be similar or identical to the non-contact current measurement systems discussed above in many respects. Thus, some or all of the discussion above regarding the features of the non-contact current measurement systems above may also apply to the non-contact current measurement system 500.

The non-contact current measurement system 500 includes a housing 502 having a front end 504 and a grip portion or end 506 opposite the front end. The housing 502 includes a user interface 508 (e.g., display, buttons, dial) positioned on a surface of the housing. The front end 504 includes a current sensor 512 (e.g., magnetic field sensor), an optional reference signal sensor 513, and a retractable hook or clamp member 514 for grasping an insulated wire (e.g., insulated wire 106 of FIGS. 1, 2A and 2B). The front end 504 includes a front end surface 516 adjacent the current sensor 512 and the clamp member 514 includes a clamp surface 518 opposite the front end surface 516. In use, an insulated wire may be clamped between the front end surface 516 and the clamp surface 518 to position the insulated wire adjacent the current sensor 512. The clamp member 514 may be permanently attached to the housing 502 or may be selectively detachable from the housing. The non-contact current measurement system 500 also includes a position feedback sensor 520 and optionally includes a biasing member 522 to bias the clamp member 514 toward the housing 502 to clamp an insulated wire between the front end surface 516 and the clamp surface 518. FIG. 6 below provides additional discussion of embodiments of a current sensor and a position feedback sensor that are suitable for use in the non-contact current measurement system 500.

Figure 6:
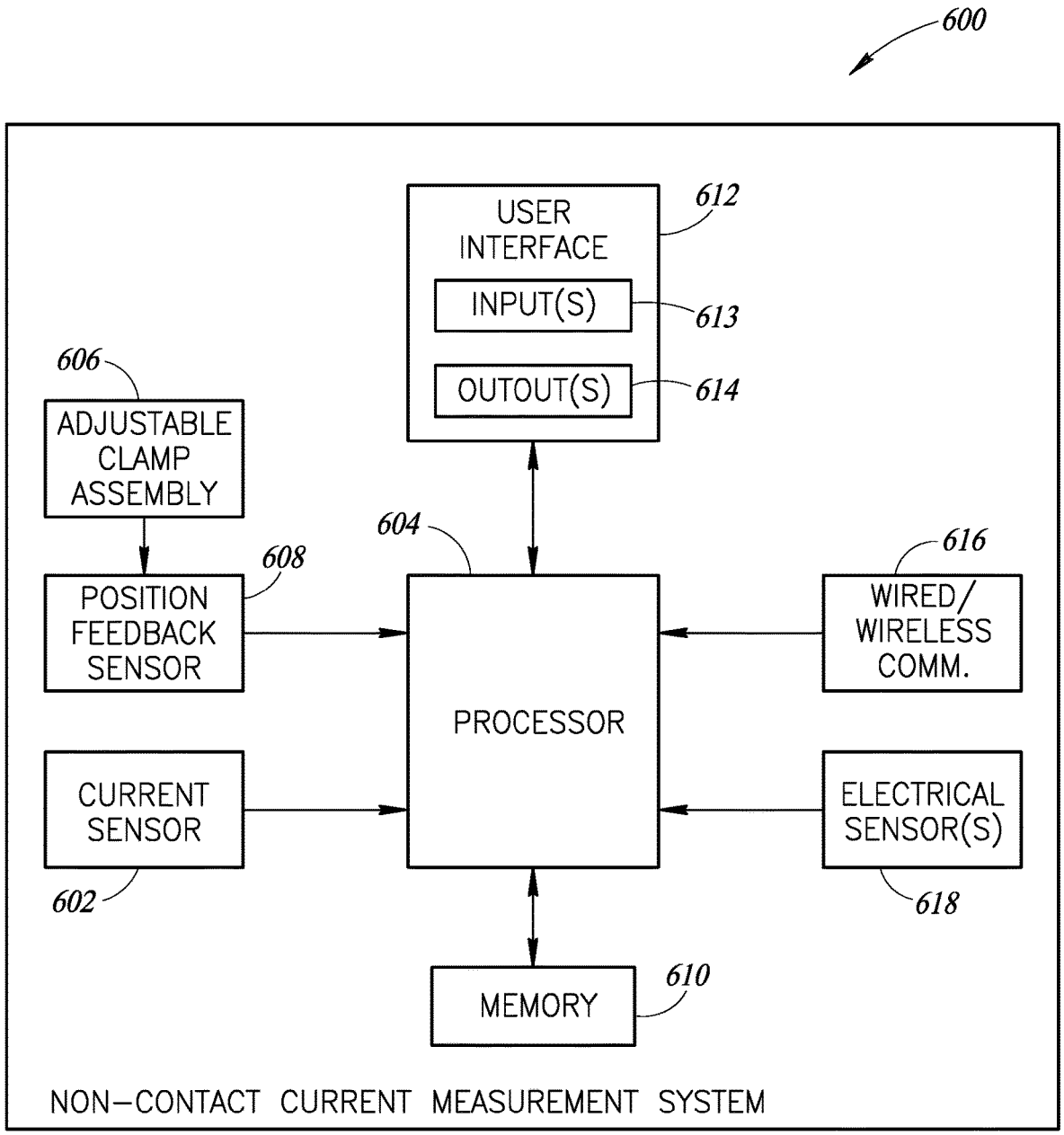
FIG. 6 is a schematic block diagram of a non-contact current measurement system, according to one illustrated implementation.

FIG. 6 is a schematic block diagram of a non-contact current measurement system or instrument 600 which provides non-contact current measurement functionality. The non-contact current measurement system 600 may be similar or identical to any of the non-contact current measurement systems discussed herein.

The non-contact current measurement system 600 includes a current sensor 602 (e.g., magnetic field sensor) communicatively coupled to a processor 604. The non-contact current measurement system 600 also includes an adjustable clamp assembly 606, and a position feedback sensor 608 operatively coupled to the adjustable clamp assembly and the processor 604. In operation, the position feedback sensor 608 generates a position feedback sensor signal indicative of the position of the adjustable clamp assembly 606, and from the detected position, determines a diameter of an insulated wire clamped in the adjustable clamp assembly 606, as discussed above. The processor 604 receives the position feedback sensor signal from the position feedback sensor 608.

The current sensor 602 may be any suitable non-contact current sensor, such as a magnetic field sensor, Hall Effect sensor, etc. In operation, the current sensor 602 generates a current sensor signal that is indicative of at least one characteristic of a current flowing through the insulated wire clamped in the adjustable clamp assembly 606. For example, the at least one characteristic may include a magnitude of the current or a frequency of the current. In implementations wherein the current sensor 602 is a magnetic field sensor, the current sensor may generate a magnetic field sensor signal that is indicative of a magnetic field produced by the current flowing through the insulated wire, which magnetic field may be analyzed by the processor 604 to determine the at least one characteristic of the current flowing through the insulated wire.

The adjustable clamp assembly 606 may be similar or identical to any of the adjustable clamp assemblies discussed herein. The position feedback sensor 608 is operative to generate a position feedback sensor signal indicative of a clamp position of the adjustable clamp assembly 606, which in turn is indicative of a diameter of the insulated wire clamped by the adjustable clamp assembly. The position feedback sensor 608 may be any suitable position sensor including, but not limited to, a resistive sensor, a magneto-resistive sensor, a Hall Effect sensor, an optical sensor, etc.

The processor 604 may include one or more logic processing units, such as one or more central processing units (CPUs), microprocessors, digital signal processors (DSPs), application-specific integrated circuits (ASICs), field programmable gate arrays (FPGAs), microcontrollers, other programmable circuits, combinations of the above, etc. Generally, the processor 604 may serve as the computational center of the non-contact current measurement system 600 by supporting the execution of instructions and reading and writing data to one or more storage devices, I/O interfaces, and communication systems.

The non-contact current measurement system 600 may also include memory 610 communicatively coupled to the processor 604 which stores at least one of instructions or data thereon. The memory 610 may include one or more solid state memories, for instance flash memory or solid state drive (SSD), which provide nonvolatile storage of computer-readable instructions, data structures, program modules and other data for the non-contact current measurement system 600. Although not depicted, the non-contact current measurement system 600 can employ other nontransitory computer- or processor-readable media, for example a hard disk drive, an optical disk drive, or memory card media drive.

The non-contact current measurement system 600 may include a user interface 612 which may include any number of inputs 613 (e.g., buttons, dials, switches, touch sensor, touchscreen, trigger switches, selectors, rotary switches) and any number of outputs 614 (e.g., display, LEDs, speakers, buzzers). Non-limiting examples of display devices include a liquid crystalline display (LCD) device, a light emitting diode (LED) device, and/or an organic light emitting diode (OLED) device. The user interface 612 may include a touch screen, which may be any type of touch screen currently known or later developed. For example, the touch screen may be a capacitive, infrared, resistive, or surface acoustic wave (SAW) device. In implementations wherein the non-contact current measurement system 600 includes a display, the display may presents readouts and/or waveforms indicative of at least one characteristic (e.g., magnitude, frequency) of the current flowing through the insulated wire under test.

In operation, the processor 604 receives the sensor signals from the position feedback sensor 608 and the current sensor 602 to obtain clamp position and current measurements, respectively. As discussed above, the clamp position measurement is indicative of the diameter of the insulated wire under test, and the current sensor signal may be indicative of at least one characteristic (e.g., magnitude) of the current flowing through the insulated wire. As discussed above, the processor 604 may utilize such measurements to determine at least one characteristic of the current flowing through the insulated wire under test, such as the magnitude and/or frequency of the current flowing through the insulated wire.

The processor 604 may provide readouts of one or more of the measured or determined characteristics (e.g., current magnitude, current frequency, diameter of insulated wire), and may provide graphical representations of one or more characteristics. Such graphical representations may include waveforms, harmonic bar graphs, etc.

To communicate with one or more external processor-based devices, the non-contact current measurement system 600 may include one or more wired and/or wireless communications interfaces 616. Non-limiting examples of wireless communications interfaces include Wi-Fi®, Bluetooth®, Bluetooth® Low Energy, ZigBee®, 6LoWPAN®, Optical IR, wireless HART, etc. Non-limiting examples of wired communications interfaces include USB®, Ethernet, PLC, HART, MODBUS, FireWire®, Thunderbolt®, etc.

In addition to sending data to external device, in at least some implementations the non-contact current measurement system 600 may receive at least one of data or instructions (e.g., control instructions) from an external device via the wired and/or wireless communications interface 616.

In at least some implementations, the non-contact current measurement system 600 may not include a display and instead may be used as a sensor to monitor electrical equipment remotely via an external processor-based device. Such processor-based device may include various types of devices, such as smartphones, tablet computers, laptop computers, wearable computers, servers, cloud computers, etc. The external processor-based device may include a display to present data gathered by the non-contact current measurement system 600 over a period of time (e.g., minutes, hours, days, weeks).

In at least some implementations, the non-contact current measurement system may include one or more additional electrical sensors 618 communicatively coupled to the processor 604. Such electrical sensors 618 may include a voltage sensor capable of sensing voltage, a resistance sensor capable of sensing resistance, a capacitive sensor capable of sensing capacitance, etc. In such implementations that include one or more additional sensors 618, the non-contact current measurement system 600 may function as a multimeter that provides a plurality of electrical characteristics (e.g., current, voltage, power, resistance, capacitance).

In at least some implementations, the electrical sensor 618 may comprise a reference signal sensor that is operative to detect a thickness of the insulation of an insulated wire under test. Various example reference signal sensors are discussed further below with reference to FIGS. 7-21. In such implementations, the adjustable clamp assembly 606 and position feedback sensor 608 may be used to determine the overall diameter of an insulated wire, and the reference signal sensor 618 may utilize a reference signal method, discussed further below, to determine the thickness of the insulation of the insulated wire. Using the overall diameter of the insulated wire determined by the adjustable clamp assembly 606 and position feedback sensor 608, and the determined insulation thickness determined by the reference signal sensor 618, the non-contact current measurement system may automatically determine the diameter of the conductor of the insulated wire, which is equal to the overall diameter of the insulated wire reduced by two times the determined insulation thickness. The determined diameter of the conductor may then be used in conjunction with the detected magnetic field to determine the magnitude of the current flowing through the insulated wire.

The following discussion provides examples of systems and methods which utilize a "reference signal" method for measuring at least one physical dimension (e.g., insulation thickness) of an insulated wire without requiring a galvanic connection between the conductor of an insulated wire and a sensor or electrode ("reference signal sensor"). As noted above, in at least some implementations, a non-contact current measurement system may utilize the reference signal method, with or without mechanical position feedback, to determine or estimate one or more physical dimensions (e.g., diameter of a conductor) of an insulated wire. As also discussed below, the reference signal method may additionally or alternatively be utilized to measure alternating current (AC) voltage of an insulated or blank uninsulated conductor (e.g., insulated wire) without requiring a galvanic connection between the conductor and the test electrode or probe. The implementations disclosed below may be referred to herein as "reference signal type" sensors or systems.

Figure 7A:
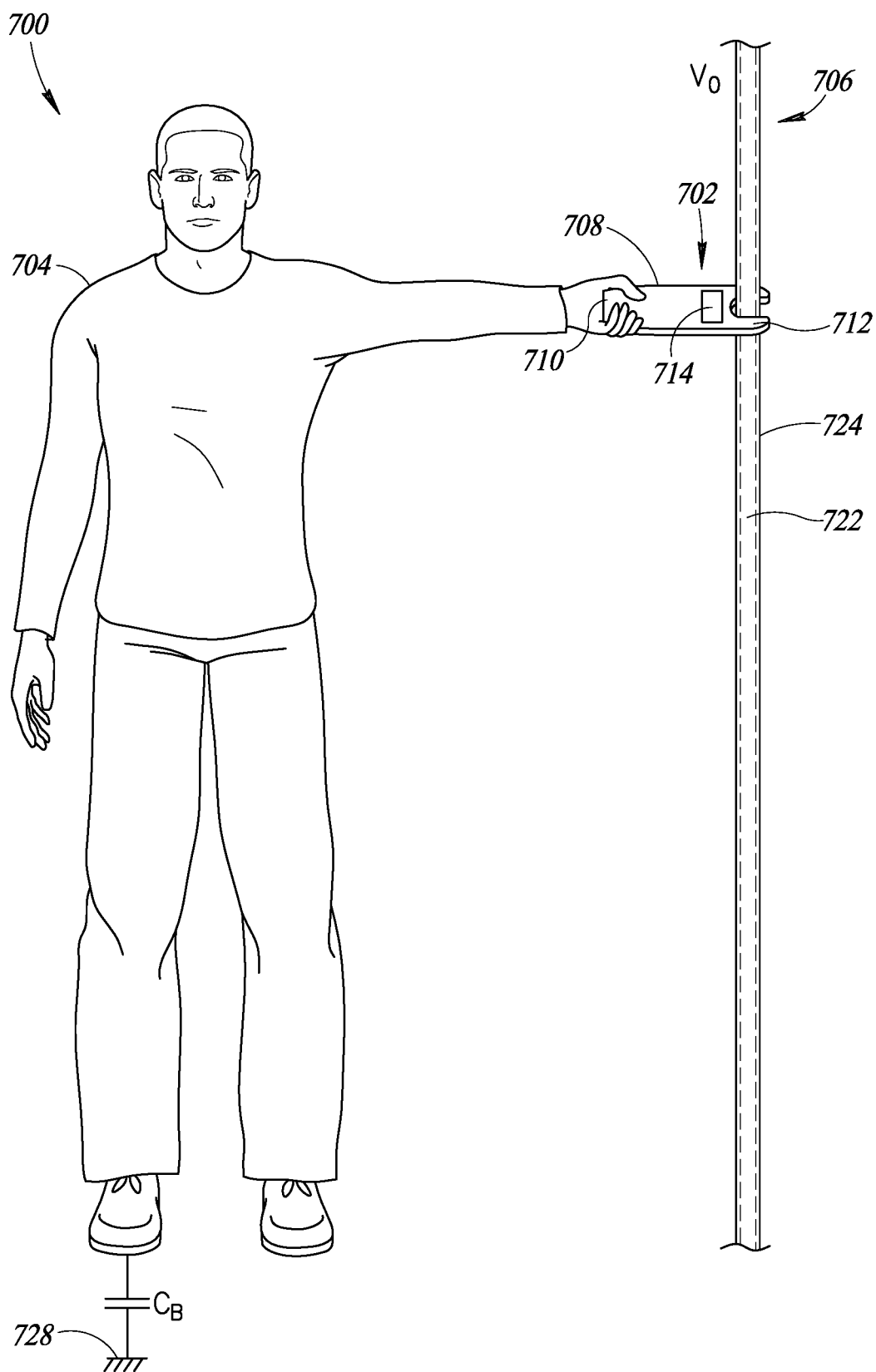
FIG. 7A is a pictorial diagram of an environment in which a non-contact measurement system including a reference signal type sensor may be used by an operator to measure insulation thickness of an insulated wire without requiring galvanic contact with the wire, according to one illustrated implementation.
Figure 7B:
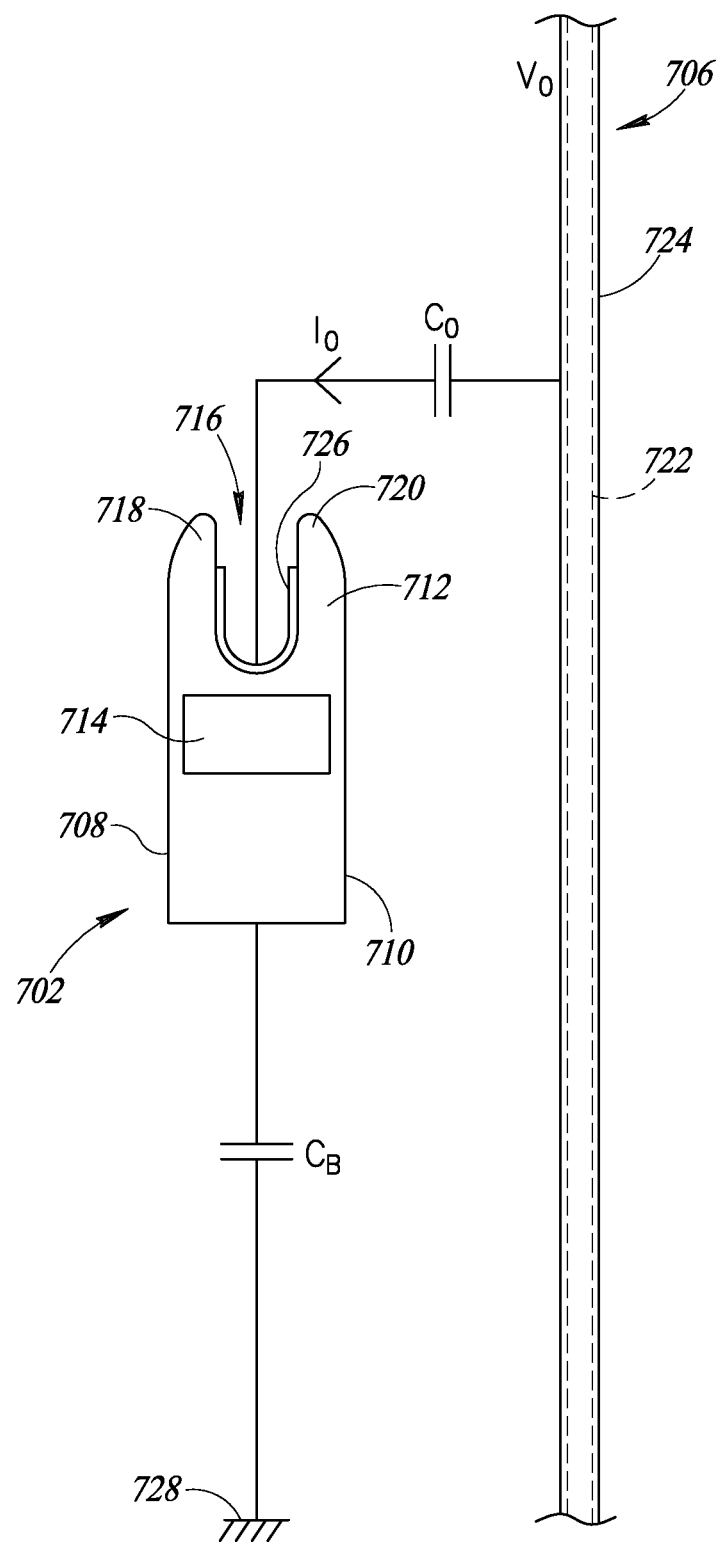
FIG. 7B is a top view of the non-contact measurement system of FIG. 7A, showing a coupling capacitance formed between the insulated wire and a conductive sensor of the non-contact measurement system, an insulated conductor current component, and a body capacitance between the non-contact measurement system and the operator, according to one illustrated implementation.

FIG. 7A is a pictorial diagram of an environment 700 in which a non-contact measurement system 702 that includes a reference signal type voltage sensor or system may be used by an operator 704 to measure AC current present in an insulated wire 706 without requiring galvanic contact between the non-contact measurement system and the wire 706. The non-contact measurement 702 may include some or all of the components and functionality of the non-contact current measurement systems discussed above. FIG. 7B is a top plan view of the non-contact measurement system 702 of FIG. 7A, showing various electrical characteristics of the non-contact measurement system during operation. The non-contact measurement system 702 includes a housing or body 708 which includes a grip portion or end 710 and a probe portion or end 712, also referred to herein as a front end, opposite the grip portion. The housing 708 may also include a user interface 714 which facilitates user interaction with the non-contact measurement system 702. The user interface 714 may include any number of inputs (e.g., buttons, dials, switches, touch sensor) and any number of outputs (e.g., display, LEDs, speakers, buzzers). The non-contact measurement system 702 may also include one or more wired and/or wireless communications interfaces (e.g., USB, Bluetooth®).

In at least some implementations, as shown best in FIG. 7B, the probe portion 712 may include a recessed portion 716 defined by first and second extended portions 718 and 720. The recessed portion 716 receives the insulated wire 706 (see FIG. 7A). The insulated wire 706 includes a conductor 722 and an insulator 724 surrounding the conductor 722. The recessed portion 716 may include a reference signal sensor or electrode 726 which rests proximate the insulator 724 of the insulated wire 706 when the insulated wire is positioned within the recessed portion 716 of the non-contact measurement system 702. Although not shown for clarity, the sensor 726 may be disposed inside of the housing 708 to prevent physical and electrical contact between the sensor and other objects.

As shown in FIG. 7A, in use the operator 704 may grasp the grip portion 710 of the housing 708 and place the probe portion 712 proximate the insulated wire 706 so that the non-contact measurement system 702 may accurately measure the current present in the wire, as discussed above.

Although the probe end 712 is shown as having the recessed portion 716, in other implementations the probe portion 712 may be configured differently. For example, in at least some implementations the probe portion 712 may include a selectively movable clamp, a hook, a flat or arcuate surface which includes the sensor, or other type of interface which allows a sensor of the non-contact measurement system 702 to be positioned proximate the insulated wire 706. Examples of various adjustable clamp assemblies and position feedback sensors are discussed above with reference to FIGS. 1-6. Examples of various probe portions and sensors are discussed below with reference to FIGS. 16-21.

The operator's body acting as a reference to earth/ground may only be in some implementations. The non-contact measurement functionality discussed herein is not limited to applications only measuring with respect to earth. The outside reference may be capacitively coupled to any other potential. For example, if the outside reference is capacitively coupled to another phase in three phase systems, the phase-to-phase voltages are measured. In general, the concepts discussed herein are not limited to reference with respect to earth only using a body capacitive coupling connected to a reference voltage and any other reference potential.

As discussed further below, in at least some implementations, the non-contact measurement system 702 may utilize the body capacitance ($C_B$) between the operator 704 and ground 728 during measurements. Although the term ground is used for the node 728, the node is not necessarily earth/ground but could be connected in a galvanically isolated manner to any other reference potential by capacitive coupling.

The particular systems and methods used by the non-contact measurement system 702 are discussed below with reference to FIGS. 8-21.

Figure 8:
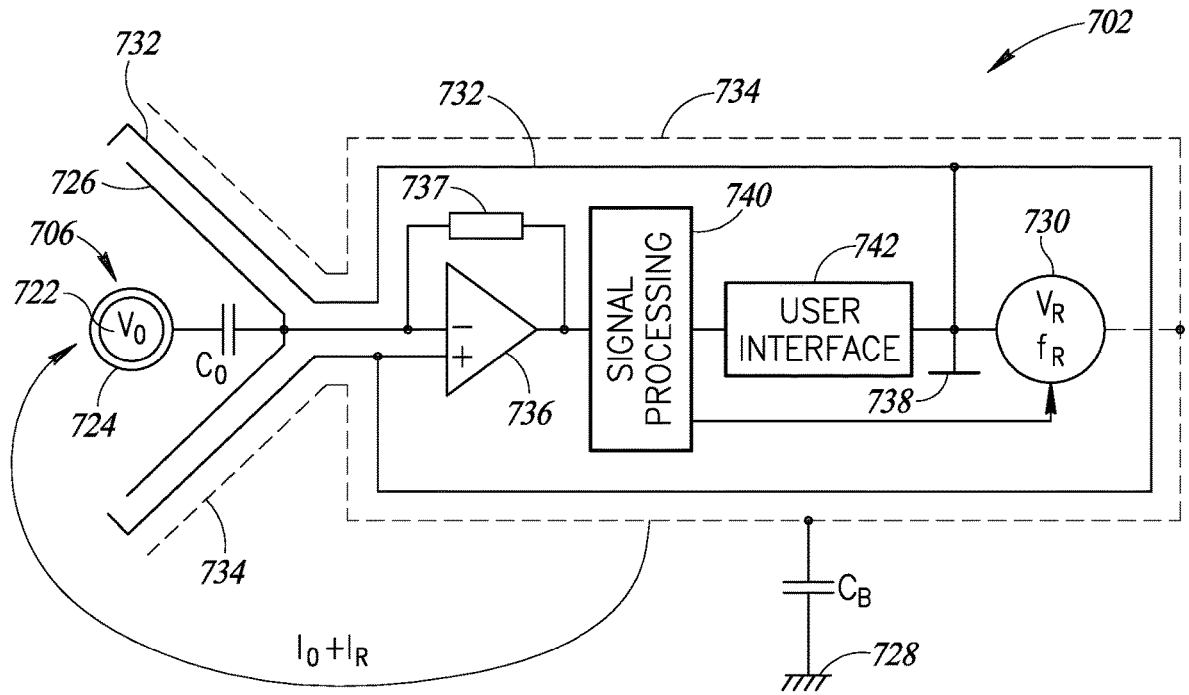
FIG. 8 is a schematic diagram of various internal components of a non-contact measurement system, according to one illustrated implementation.

FIG. 8 shows a schematic diagram of various internal components of the non-contact measurement system 702 also shown in FIGS. 7A and 7B. In this example, the conductive sensor 726 of the non-contact measurement system 702 is substantially "V-shaped" and is positioned proximate the insulated wire 706 under test and capacitively couples with the conductor 722 of the insulated wire 706, forming a sensor coupling capacitor ($C_O$). The operator 704 handling the non-contact measurement system 702 has a body capacitance ($C_B$) to ground. Thus, as shown in FIGS. 7B and 8, the AC voltage signal ($V_O$) in the wire 722 generates an insulated conductor current component or "signal current" ($I_O$) over the coupling capacitor ($C_O$) and the body capacitance ($C_B$), which are connected in series. In some implementations, the body capacitance ($C_B$) may also include a galvanically isolated test lead which generates a capacitance to ground or any other reference potential.

The AC voltage ($V_O$) in the wire 722 to be measured has a connection to an external ground 728 (e.g., neutral). The non-contact measurement system 702 itself also has a capacitance to ground 728, which consists primarily of the body capacitance ($C_B$) when the operator 704 (FIG. 7A) holds the non-contact measurement system in his hand. Both capacitances $C_O$ and $C_B$ create a conductive loop and the voltage inside the loop generates the signal current ($I_O$). The signal current ($I_O$) is generated by the AC voltage signal ($V_O$) capacitively coupled to the conductive sensor 726 and loops back to the external ground 728 through the housing 708 of the non-contact measurement system and the body capacitor ($C_B$) to ground 728. The current signal ($I_O$) is dependent on the distance between the conductive sensor 726 of the non-contact measurement system 702 and the insulated wire 706 under test, the particular shape of the conductive sensor 726, and the size and voltage level ($V_O$) in the conductor 722.

To compensate for the distance variance and consequent coupling capacitor ($C_O$) variance which directly influences the signal current ($I_O$), the non-contact measurement system 702 includes a common mode reference voltage source 730 which generates an AC reference voltage ($V_R$) which has a reference frequency ($f_R$) different from the signal voltage frequency (fo).

To reduce or avoid stray currents, at least a portion of the non-contact measurement system 702 may be surrounded by a conductive internal ground guard or screen 732 which causes most of the current to run through the conductive sensor 726 which forms the coupling capacitor ($C_O$) with the conductor 722 of the insulated wire 706. The internal ground guard 732 may be formed from any suitable conductive material (e.g., copper) and may be solid (e.g., foil) or have one or more openings (e.g., mesh).

Further, to avoid currents between the internal ground guard 732 and the external ground 728, the non-contact measurement system 702 includes a conductive reference shield 734. The reference shield 734 may be formed from any suitable conductive material (e.g., copper) and may be solid (e.g., foil) or have one or more openings (e.g., mesh). The common mode reference voltage source 730 is electrically coupled between the reference shield 734 and the internal ground guard 732, which creates a common mode voltage having the reference voltage ($V_R$) and the reference frequency ($f_R$) for the non-contact measurement system 702. Such AC reference voltage ($V_R$) drives an additional reference current ($I_R$) through the coupling capacitor ($C_O$) and the body capacitor ($C_B$).

The internal ground guard 732 which surrounds at least a portion of the conductive sensor 726 protects the conductive sensor against direct influence of the AC reference voltage ($V_R$) causing an unwanted offset of reference current ($I_R$) between the conductive sensor 726 and the reference shield 734. As noted above, the internal ground guard 732 is the internal electronic ground 738 for the non-contact measurement system 702. In at least some implementations, the internal ground guard 732 also surrounds some or all of the electronics of the non-contact measurement system 702 to avoid the AC reference voltage ($V_R$) coupling into the electronics.

As noted above, the reference shield 734 is utilized to inject a reference signal onto the input AC voltage signal ($V_O$) and as a second function minimizes the guard 732 to earth ground 728 capacitance. In at least some implementations, the reference shield 734 surrounds some or all of the housing 708 of the non-contact measurement system 702. In such implementations, some or all of the electronics see the reference common mode signal which also generates the reference current ($I_R$) between the conductive sensor 726 and the conductor 722 in the insulated wire 706. In at least some implementations, the only gap in the reference shield 734 may be an opening for the conductive sensor 726 which allows the conductive sensor to be positioned proximate the insulated wire 706 during operation of the non-contact measurement system 702.

The internal ground guard 732 and the reference shield 734 may provide a double layer screen around the housing 708 (see FIGS. 7A and 7B) of the non-contact measurement system 702. The reference shield 734 may be disposed on an outside surface of the housing 708 and the internal ground guard 732 may function as an internal shield or guard. The conductive sensor 726 is shielded by the guard 732 against the reference shield 734 such that any reference current flow is generated by the coupling capacitor ($C_O$) between the conductive sensor 726 and the conductor 722 under test.

The guard 732 around the sensor 726 also reduces stray influences of adjacent wires close to the sensor.

As shown in FIG. 8, the non-contact measurement system 702 may include an input amplifier 736 which operates as an inverting current-to-voltage converter. The input amplifier 736 has a non-inverting terminal electrically coupled to the internal ground guard 732 which functions as the internal ground 738 of the non-contact measurement system 702. An inverting terminal of the input amplifier 736 may be electrically coupled to the conductive sensor 726. Feedback circuitry 737 (e.g., feedback resistor) may also be coupled between the inverting terminal and the output terminal of the input amplifier 736 to provide feedback and appropriate gain for input signal conditioning.

The input amplifier 736 receives the signal current ($I_O$) and reference current ($I_R$) from the conductive sensor 726 and converts the received currents into a sensor current voltage signal indicative of the conductive sensor current at the output terminal of the input amplifier. The sensor current voltage signal may be an analog voltage, for example. The analog voltage may be fed to a signal processing module 740 which, as discussed further below, processes the sensor current voltage signal to estimate or determine the thickness of the insulation layer 724 of the insulated wire 706 and/or to determine the AC voltage ($V_O$) in the conductor 722 of the insulated wire 706. As discussed above, a determined thickness of the insulation layer 724 of the insulated wire 706 may be used at least in part to estimate or determine at least one physical dimension (e.g., diameter) of the conductor 722, which may be used along with a magnetic field measurement to determine the current flowing through the conductor 722 of the insulated wire. The signal processing module 740 may include any combination of digital and/or analog circuitry.

The non-contact measurement system 702 may also include a user interface 742 (e.g., display) communicatively coupled to the signal processing module 740 to present the determined current and/or the determined voltage ($V_O$) or to communicate by an interface to the operator 704 of the non-contact measurement system.

Figure 9:
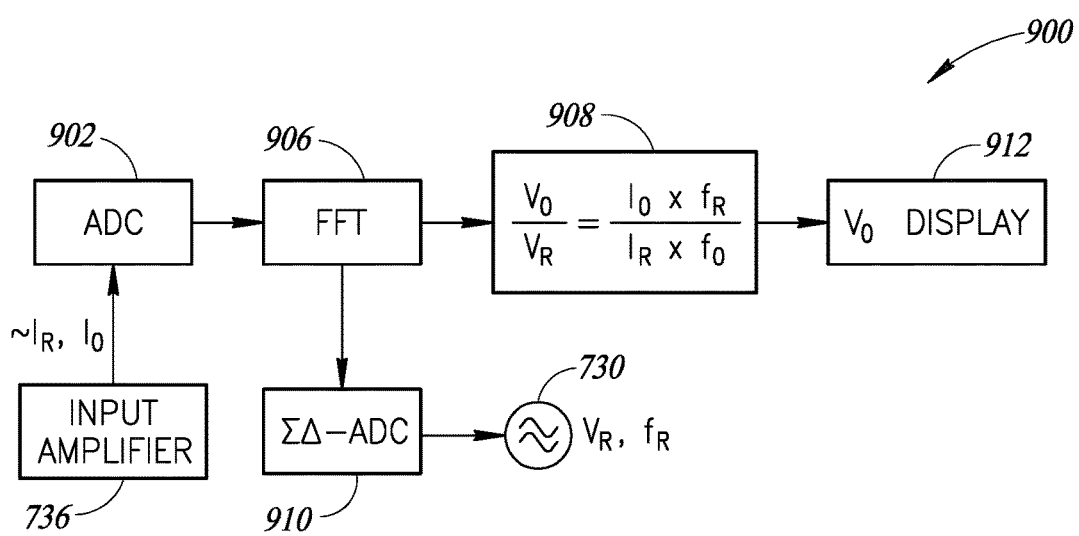
FIG. 9 is a block diagram which shows various signal processing components of a non-contact measurement system, according to one illustrated implementation.
Figure 10:
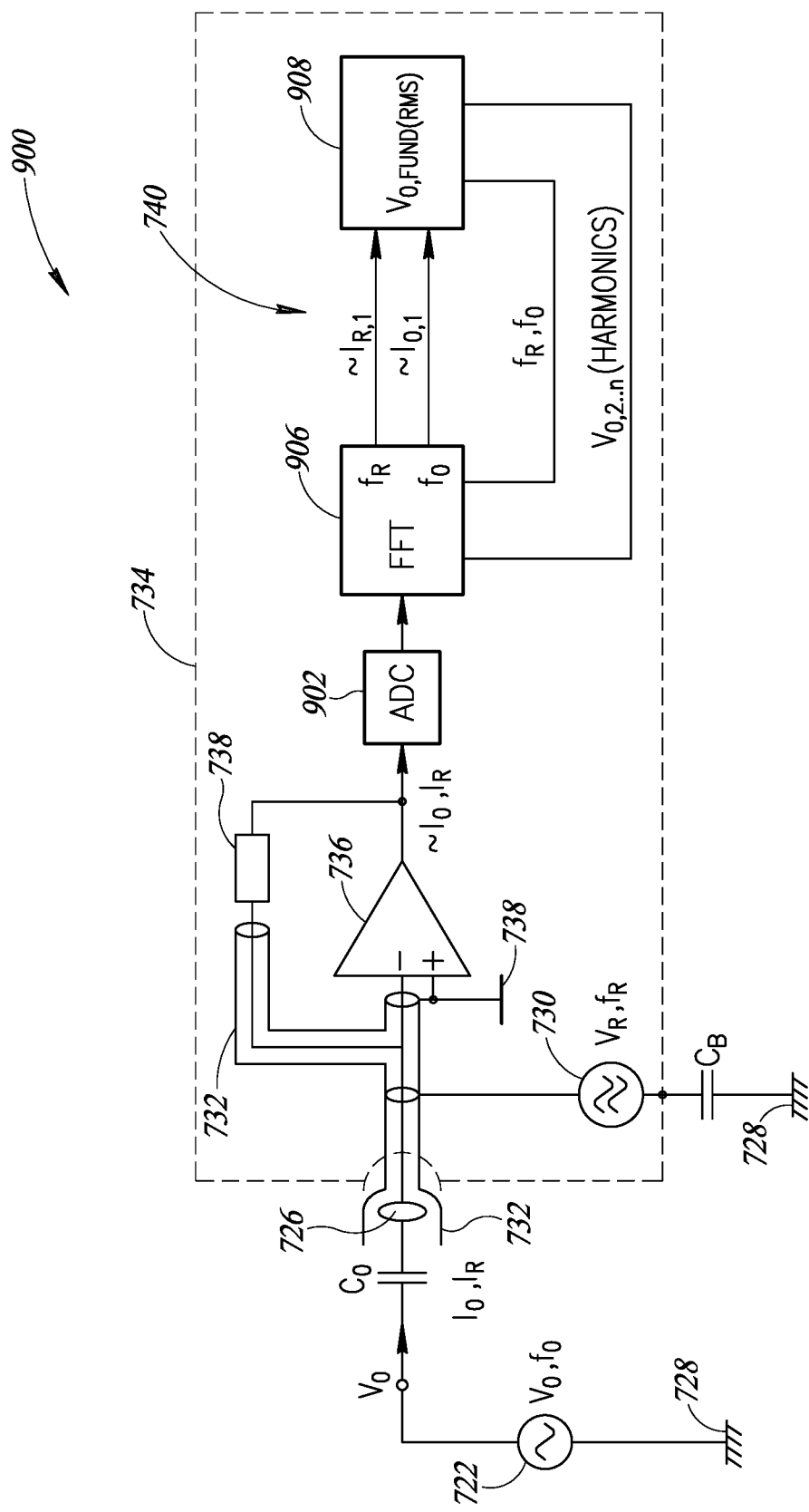
FIG. 10 is a schematic diagram of a non-contact measurement system which implements a fast Fourier transform (FFT), according to one illustrated implementation.

FIG. 9 is a block diagram of a non-contact measurement system 900 which shows various signal processing components of the non-contact measurement system. FIG. 10 is a more detailed diagram of the non-contact measurement system 900 of FIG. 9.

The non-contact measurement system 900 may be similar or identical to the non-contact measurement system 702 discussed above. Accordingly, similar or identical components are labeled with the same reference numerals. As shown, the input amplifier 736 converts the input current ($I_O+I_R$) from the conductive sensor 726 into a sensor current voltage signal which is indicative of the input current. The sensor current voltage signal is converted into digital form using an analog-to-digital converter (ADC) 902.

The AC voltage ($V_O$) in the wire 722 is related to the AC reference voltage ($V_R$) by Equation (1):

$$\frac{V_O}{V_R} = \frac{I_O \times f_R}{I_R \times f_O} \quad (1)$$

where ($I_O$) is the signal current through the conductive sensor 726 due to the AC voltage ($V_O$) in the conductor 722, ($I_R$) is the reference current through the conductive sensor 726 due to the AC reference voltage ($V_R$), ($f_O$) is the frequency of the AC voltage ($V_O$) that is being measured, and ($f_R$) is the frequency of the reference AC voltage ($V_R$).

Figure 11:
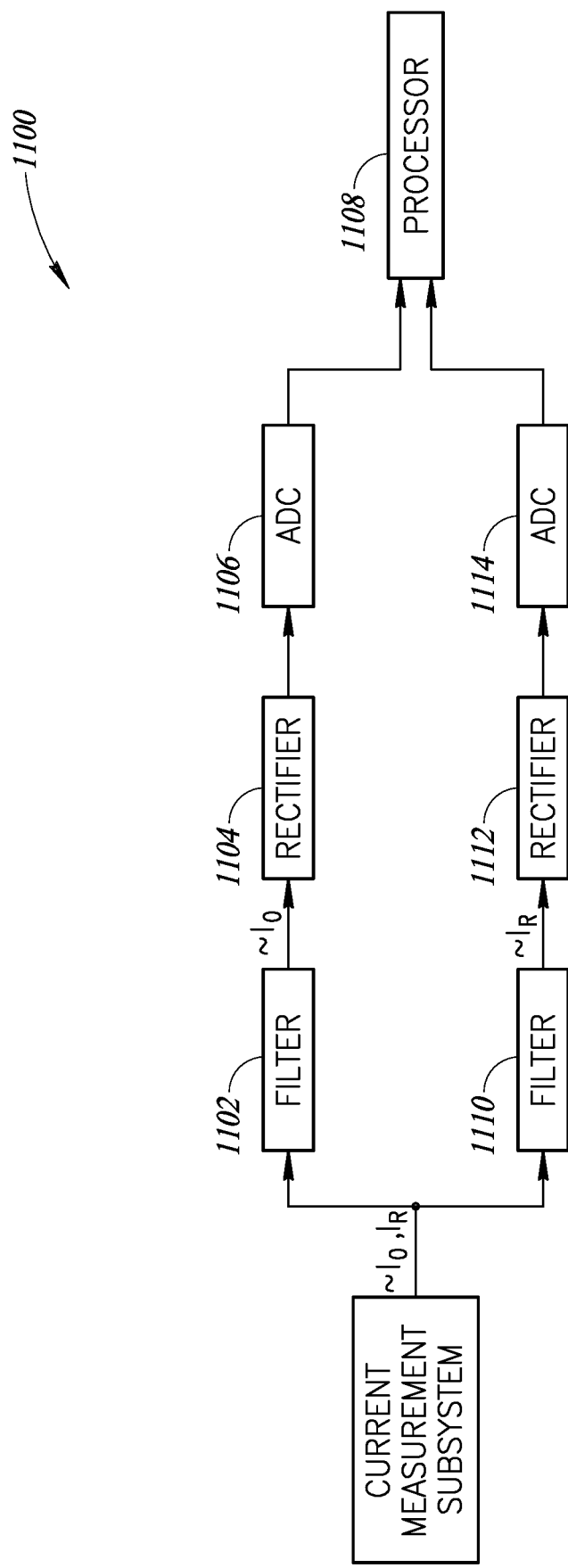
FIG. 11 is a block diagram of a non-contact measurement system which implements analog electronic filters, according to another example for signal and reference signal separation.

The signals with indices "O," which are related to the AC voltage ($V_O$), have different characteristics like frequencies than the signals with indices "R," which are related to the common mode reference voltage source 730. In the implementation of FIG. 10, digital processing, such as circuitry implementing a fast Fourier transform (FFT) algorithm 906, may be used to separate signal magnitudes with different frequencies. In the implementation of FIG. 11 discussed below, analog electronic filters may also be used to separate "O" signal characteristics (e.g., magnitude, frequency) from "R" signal characteristics.

The currents ($I_O$) and ($I_R$) are dependent on the frequencies ($f_O$) and ($f_R$), respectively, due to the coupling capacitor ($C_O$). The currents flowing through the coupling capacitor ($C_O$) and the body capacitance ($C_B$) are proportional to the frequency and thus, the frequency ($f_O$) of the AC voltage ($V_O$) in the conductor 722 under test may need to either be measured to determine the ratio of the reference frequency ($f_R$) to the signal frequency ($f_O$), which is utilized in Equation (1) listed above or the reference frequency is already known because it is generated by the system itself.

After the input current ($I_O+I_R$) has been conditioned by the input amplifier 736 and digitized by the ADC 902, the frequency components of the digital sensor current voltage signal may be determined by representing the signal in the frequency domain using the FFT 906. When both of the frequencies ($f_O$) and ($f_R$) have been measured, frequency bins may be determined to calculate the fundamental magnitudes of the currents ($I_O$) and ($I_R$) from the FFT 906.

The magnitude of the current ($I_R$) and/or the current ($I_O$) may vary as a function of distance between the reference signal sensor or electrode (e.g., electrode 726) and the conductor 722 of the insulated wire 706. Thus, the system may compare the measured current ($I_R$) and/or the current ($I_O$) to expected respective currents to determine the distance between the reference signal sensor or electrode and the conductor 722. Since during measurement the insulated wire 706 may be positioned adjacent the reference signal sensor or electrode (e.g., via an adjustable clamp assembly), the distance between the reference signal sensor and the conductor 722 of the insulated wire 706 is approximately equal to the thickness of the insulation layer 724. As discussed above, a position feedback sensor operatively coupled to an adjustable clamp assembly provides the overall diameter of the insulated wire 706. Thus, using the determined overall diameter of the insulated wire and the determined thickness of the insulation layer 724, the system may accurately determine the diameter or gauge of the conductor 722 inside the insulated wire 706. This information, along with the magnetic field measured by a magnetic field sensor (e.g., sensors 116, 312, 412, or 512), may be used to by the system to accurately determine the magnitude of the current flowing through the conductor 722 inside the insulated wire 706.

As indicated by a block 908, the ratio of the fundamental harmonics of the currents ($I_R$) and ($I_O$), designated $I_{R,1}$ and $I_{O,1}$, respectively may be corrected by the determined frequencies ($f_O$) and ($f_R$), and this factor may be used to calculate the measured original fundamental or RMS voltage by adding harmonics ($V_O$) in the wire 722, which is done by calculating the square root of the squared harmonics sum, and which may be presented to the user on a display 912 in implementations wherein the non-contact measurement system also determines AC voltage in the insulated wire 706.

The coupling capacitor ($C_O$) may generally have a capacitance value in the range of approximately 0.02 pF to 1 pF, for example, depending on the distance between the insulated conductor 706 and the conductive sensor 726, as well as the particular shape and dimensions of the sensor 726. The body capacitance ($C_B$) may have a capacitance value of approximately 20 pF to 200 pF, for example.

From Equation (1) above, it can be seen that the AC reference voltage ($V_R$) generated by the common mode reference voltage source 730 does not need to be in the same range as the AC voltage ($V_O$) in the conductor 722 to achieve similar current magnitudes for the signal current ($I_O$) and the reference current ($I_R$). The AC reference voltage ($V_R$) may be relatively low (e.g., less than 5 V) by selecting the reference frequency ($f_R$) to be relatively high. As an example, the reference frequency ($f_R$) may be selected to be 3 kHz, which is 50 times higher than a typical 120 VRMS AC voltage ($V_O$) having a signal frequency ($f_O$) of 60 Hz. In such case, the AC reference voltage ($V_R$) may be selected to be only 2.4 V (i.e., 120 V±50) to generate the same reference current ($I_R$) as the signal current ($I_O$). In general, setting the reference frequency ($f_R$) to be N times the signal frequency ($f_O$) allows the AC reference voltage ($V_R$) to have a value that is (1/N) times the AC voltage ($V_O$) in the wire 722 to produce currents ($I_R$) and ($I_O$) which are in the same range as each other to achieve a similar uncertainty for $I_R$ and $I_o$.

Any suitable signal generator may be used to generate the AC reference voltage ($V_R$) having the reference frequency ($f_R$). In the example illustrated in FIG. 9, a Sigma-Delta digital-to-analog converter ($\Sigma$-$\Delta$ DAC) 910 is used. The $\Sigma$-$\Delta$ DAC 910 uses a bit stream to create a waveform (e.g., sinusoidal waveform) signal with the defined reference frequency ($f_R$) and AC reference voltage ($V_R$). In at least some implementations, the $\Sigma$-$\Delta$ DAC 910 may generate a waveform that is in phase with the window of the FFT 906 to reduce jitter.

In at least some implementations, the ADC 902 may have 14 bits of resolution. In operation, the ADC 902 may sample the output from the input amplifier 736 at a sampling frequency of 10.24 kHz for nominal 50 Hz input signals to provide $2^n$ samples (1024) in 100 ms (10 Hz bins for the FFT 906) ready for processing by the FFT 906. For 60 Hz input signals, the sampling frequency may be 12.288 kHz, for example, to get the same number of samples per cycle. The sampling frequency of the ADC 902 may be synchronized to full numbers of cycles of the reference frequency ($f_R$). The input signal frequency may be within a range of 40-70 Hz, for example. Depending on the measured frequency of the AC voltage ($V_O$), the bins for the AC voltage ($V_O$) may be determined using the FFT 906 and use a Hanning window function for further calculations to suppress phase shift jitter caused by incomplete signal cycles captured in the aggregation interval.

In one example, the common mode reference voltage source 730 generates an AC reference voltage ($V_R$) which has a reference frequency ($f_R$) of 2419 Hz. This frequency is in between the 40$^{th}$ harmonic and the 41$^{st}$ harmonic for 60 Hz signals, and between the 48$^{th}$ harmonic and 49$^{th}$ harmonic for 50 Hz signals. By providing an AC reference voltage ($V_R$) which has a reference frequency ($f_R$) that is not a harmonic of the expected AC voltage ($V_O$), the AC voltage ($V_O$) is less likely to influence measurement of the reference current ($I_R$).

In at least some implementations, the reference frequency ($f_R$) of the common mode reference voltage source 730 is selected to be a frequency that is least likely to be affected by harmonics of an AC voltage ($V_O$) in the conductor 722 under test. As an example, the common mode reference voltage source 730 may be switched off when the reference current ($I_R$) exceeds a limit, which may indicate that the conductive sensor 726 is approaching the conductor 722 under test. A measurement (e.g., 100 ms measurement) may be taken with the common mode reference voltage source 730 switched off to detect signal harmonics at a number (e.g., three, five) of candidate reference frequencies. Then, the magnitude of the signal harmonics in the AC voltage ($V_O$) may be determined at the number of candidate reference frequencies to identify which candidate reference frequency is likely to be least affected by the signal harmonics of the AC voltage ($V_O$). The reference frequency ($f_R$) may then be set to the identified candidate reference frequency. This switching of the reference frequency may avoid or reduce the impact of possible reference frequency components in the signal spectrum, which may increase the measured reference signal and reduce accuracy, and may create unstable results. Other frequencies besides 2419 Hz that have the same characteristics include 2344 Hz and 2679 Hz, for example.

FIG. 11 is a block diagram of a signal processing portion 1100 of a non-contact measurement system which implements electronic filters. The signal processing portion 1100 may receive a sensor current voltage signal that is proportional to the conductive sensor 726 current ($I_O$+$I_R$) from a current measurement subsystem (e.g., input amplifier 736).

As discussed above, the signal current ($I_O$) has a different frequency than the reference current ($I_R$). To isolate the signal current ($I_O$) from the reference current ($I_R$), the signal processing portion 1100 may include a first filter 1102 which operates to pass the signal current ($I_O$) and reject the reference current ($I_R$). The filtered signal may then be rectified by a first rectifier 1104 and digitized by a first ADC 1106. The digitized signal may be fed to a suitable processor 1108 for use in calculations, as discussed above. Similarly, to isolate the reference current ($I_R$) from the signal current ($I_O$), the signal processing portion 1100 may include a second filter 1110 which operates to pass the reference current ($I_R$) and reject the signal current ($I_O$). The filtered signal may then be rectified by a second rectifier 1112 and digitized by a second ADC 1114. The digitized signal may be fed to a suitable processor 1108 for use in calculations. The first and second filters 1102 and 1110 may be any suitable analog filters, and may each include a number of discrete components (e.g., capacitors, inductors).

Figure 12:
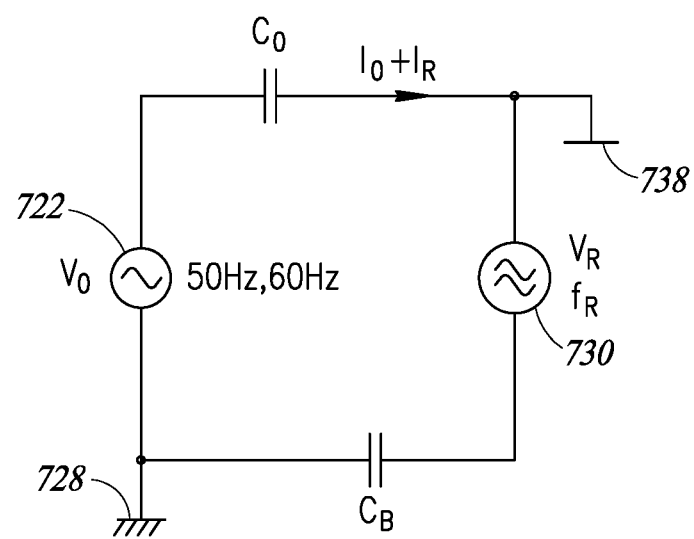
FIG. 12 is a schematic circuit diagram of a non-contact measurement system, according to one illustrated implementation.

FIG. 12 is a schematic circuit diagram of portions of a non-contact measurement system, such as any of the non-contact measurement systems discussed above, showing the loop formed by the common mode reference voltage source 730, the body capacitance ($C_B$), the coupling capacitor ($C_O$), the wire 722, the external ground 728, and the internal ground 738.

Figure 13A:
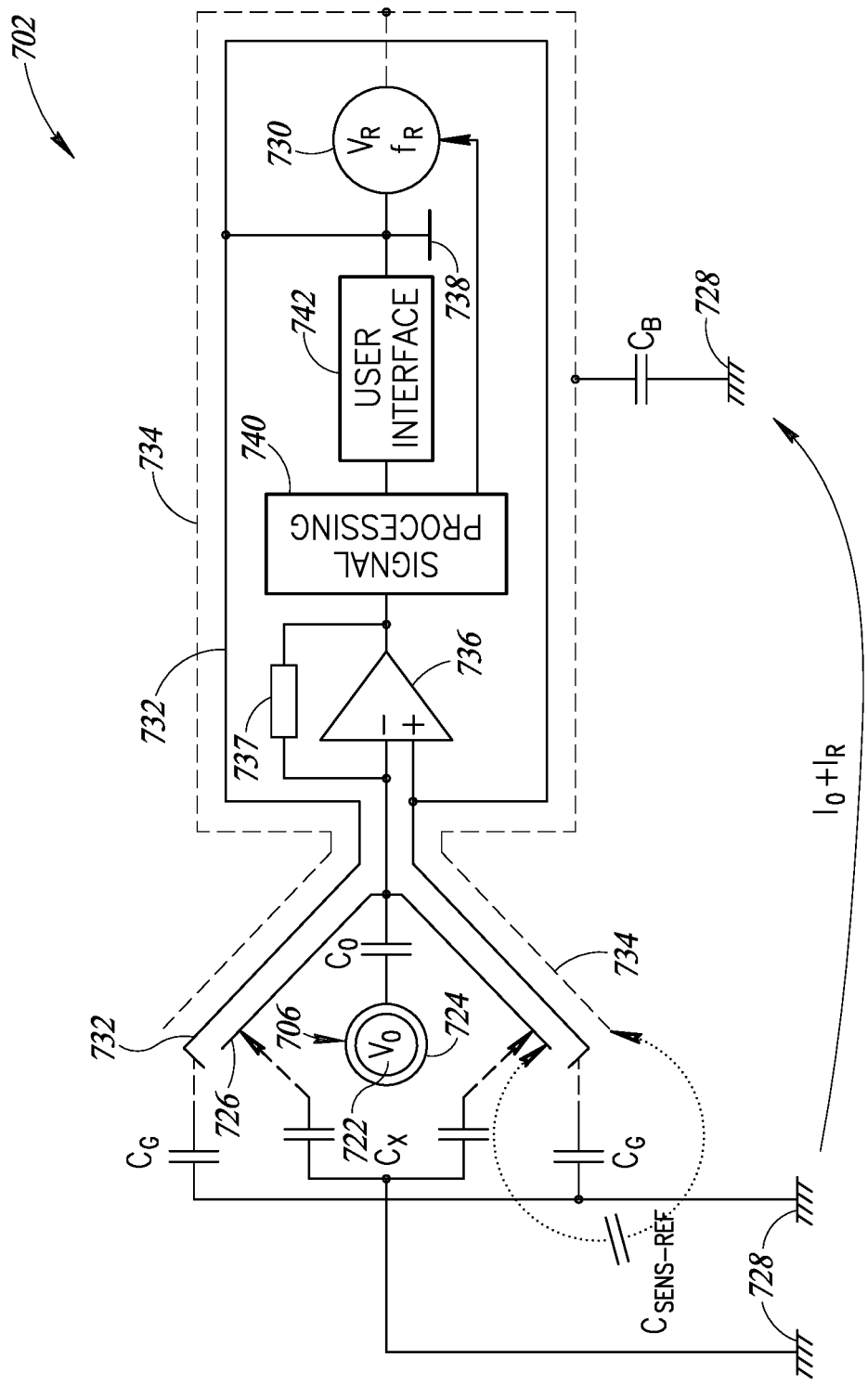
FIG. 13A is a schematic diagram of a non-contact measurement system which shows various leakage and stray capacitances, according to one illustrated implementation.

FIG. 13A is a schematic diagram of the non-contact measurement system 702, which shows various leakage and stray capacitances. Generally, removal of the influences of different stray capacitors seen by the system (e.g., sensor 726) cannot be completely achieved by special sensor design and screening methods even with sophisticated shielding techniques. As discussed above, implementations of the present disclosure utilize the common mode reference voltage source 730 to generate a reference voltage with a reference frequency ($f_R$) that is different from the measured signal frequency (fo) to compensate for the stray capacitances seen by the system.

In particular, in addition to the coupling capacitor ($C_O$), FIG. 13A shows the body capacitance ($C_B$), a capacitance ($C_X$), a capacitance ($C_{SENS-REF}$), and a capacitance ($C_G$). The body capacitance ($C_B$) is in series with the coupling capacitor ($C_O$) and, in typical applications, the body capacitance ($C_B$) is much greater than the coupling capacitor ($C_O$). Thus, the body capacitance ($C_B$) only impacts the magnitudes of the currents ($I_O+I_R$), but does not impact the ratio ($I_O/I_R$) of the currents.

Figure 14:
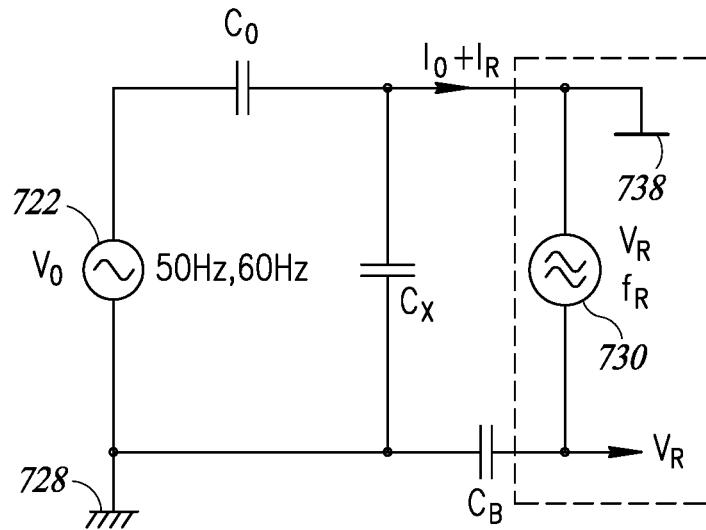
FIG. 14 is a schematic circuit diagram of a non-contact measurement system which shows a capacitance between a sensor of the non-contact measurement system and an external ground, according to one illustrated implementation.

As shown in FIGS. 13A and 14, the capacitance ($C_X$) is the sensor capacitance between the conductive sensor 726 and the external ground 728. The coupling capacitor ($C_O$) is not the only capacitance between the wire 722 and the sensor 726. There is also the capacitance ($C_X$) between the sensor 726 and the external ground 728, especially for thin wires which do not substantially cover the area of the sensor 726. The capacitance ($C_X$) has a capacitive voltage divider effect for the signal current ($I_O$), and may result in a lower voltage measurement for the AC voltage ($V_O$). The capacitance ($C_X$) therefore reduces the magnitudes of the currents ($I_O+I_R$). However, the reference current ($I_R$) is divided by the same ratio and, thus, also compensates for the stray capacitor ($C_X$), so the ratio ($I_O/I_R$) is not impacted. To also avoid any internal current flows to outside the non-contact measurement system, as discussed above in at least some implementations the whole measurement system except for the sensing area may be shielded by the reference shield 734 from the outside environment and connected to the output of the common mode reference voltage source 730 to create the reference current ($I_R$).

As shown in FIG. 13A, the capacitance ($C_{SENS-REF}$) is the remaining capacitance between the reference shield 734 and the conductive sensor 726. The capacitance ($C_{SENS-REF}$) causes an offset for the sensor current ($I_O+I_R$) which is present even when the AC voltage ($V_O$) in the wire 706 is not being measured.

Figure 15A:
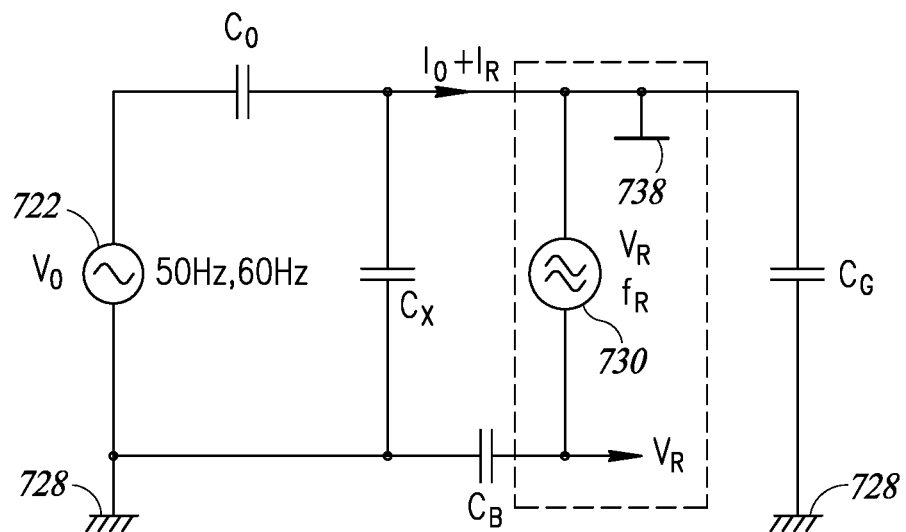
FIG. 15A is a schematic circuit diagram of a non-contact measurement system which shows a capacitance between an internal ground guard of the non-contact measurement system and an external ground, according to one illustrated implementation.
Figure 15B:
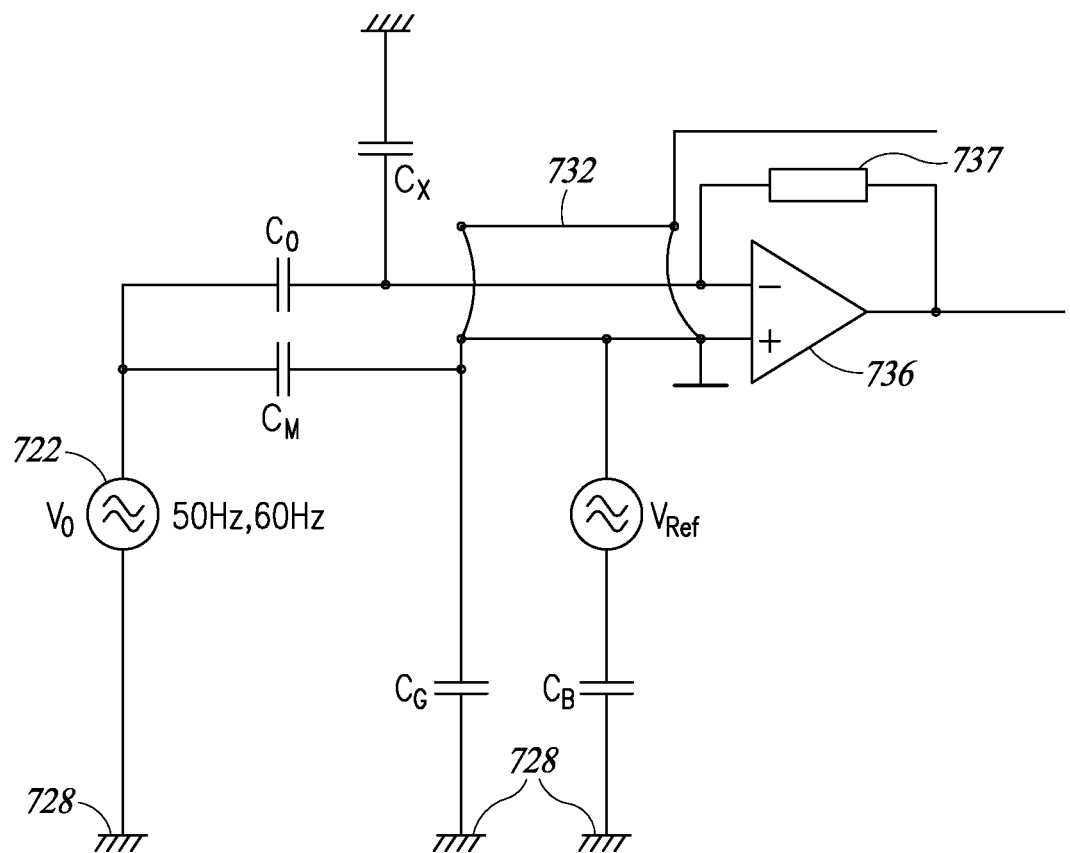
FIG. 15B is a schematic circuit diagram of a non-contact measurement system which shows a capacitance between an internal ground guard of the non-contact measurement system and an external ground, according to one illustrated implementation.

As shown in FIGS. 13A and 15A, the capacitance ($C_G$) is the capacitance between the internal ground 738 and the external ground 728 or reference potential. The capacitance ($C_G$) is a parallel path for the reference current ($I_R$), and reduces the reference current. Thus, the capacitance ($C_G$) causes an increase in the calculated result for the AC voltage ($V_O$) in the wire 706. See FIG. 15B, which shows the impact of the capacitance ($C_G$). In particular, the capacitance ($C_G$) influences $I_R$ and $I_O$ differently, and therefore influences the ratio $I_O/I_R$.

$$I_O = V_O \cdot f_O \cdot \frac{[(C_O // C_M) \text{ in series } (C_G // C_B)] \cdot C_O}{C_O // C_M} = \quad (2)$$

$$= V_O \cdot f_O \cdot \frac{(C_O + C_M)(C_G + C_B) \cdot C_O}{(C_O + C_M + C_B + C_G) \cdot (C_O + C_M)} \Rightarrow \frac{C_O \cdot (C_B + C_G)}{\sum C} \quad (3)$$

$$I_R = V_R \cdot f_R \cdot \frac{((C_B \text{ in series } (C_O // C_M // C_G)) \cdot C_O}{C_O // C_M // C_G} = \quad (4)$$

$$= V_R \cdot f_R \cdot \frac{C_B \cdot (C_O + C_M + C_G) \cdot C_O}{(C_B + C_O + C_M + C_G) \cdot (C_O + C_M + C_G)} \Rightarrow \frac{C_O \cdot C_B}{\sum C} \quad (5)$$

As can be seen from equations (2)-(5) above, the ratio $I_O/I_R$ depends on $C_B/C_G$. The capacitance $C_G$ is much smaller when a reference screen is around the whole enclosure and sensor of the non-contact measurement system 702.

Figure 13B:
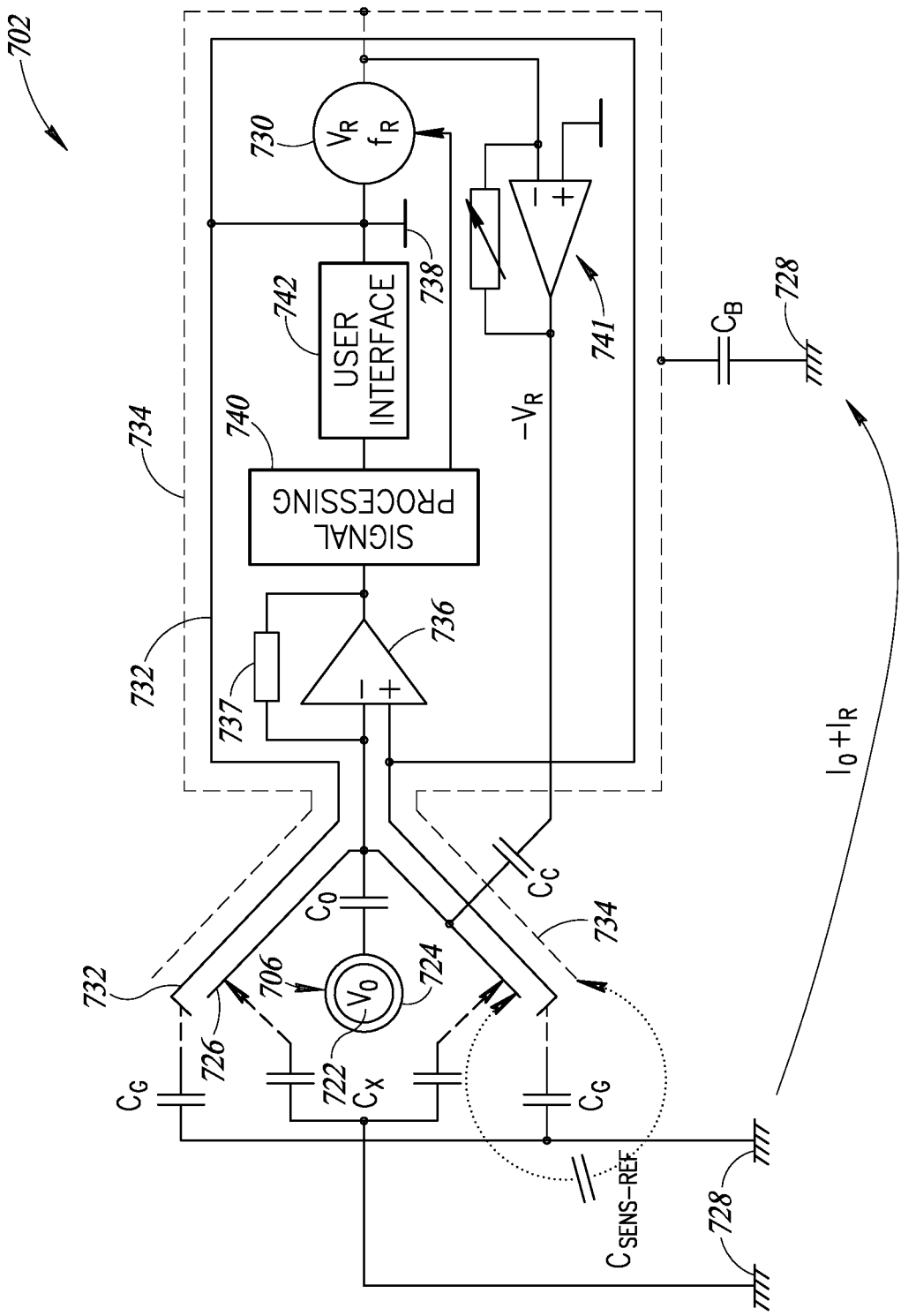
FIG. 13B is a schematic diagram of a non-contact measurement system which shows various leakage and stray capacitances and includes compensation for a reference current signal, according to one illustrated implementation.
Figure 13C:
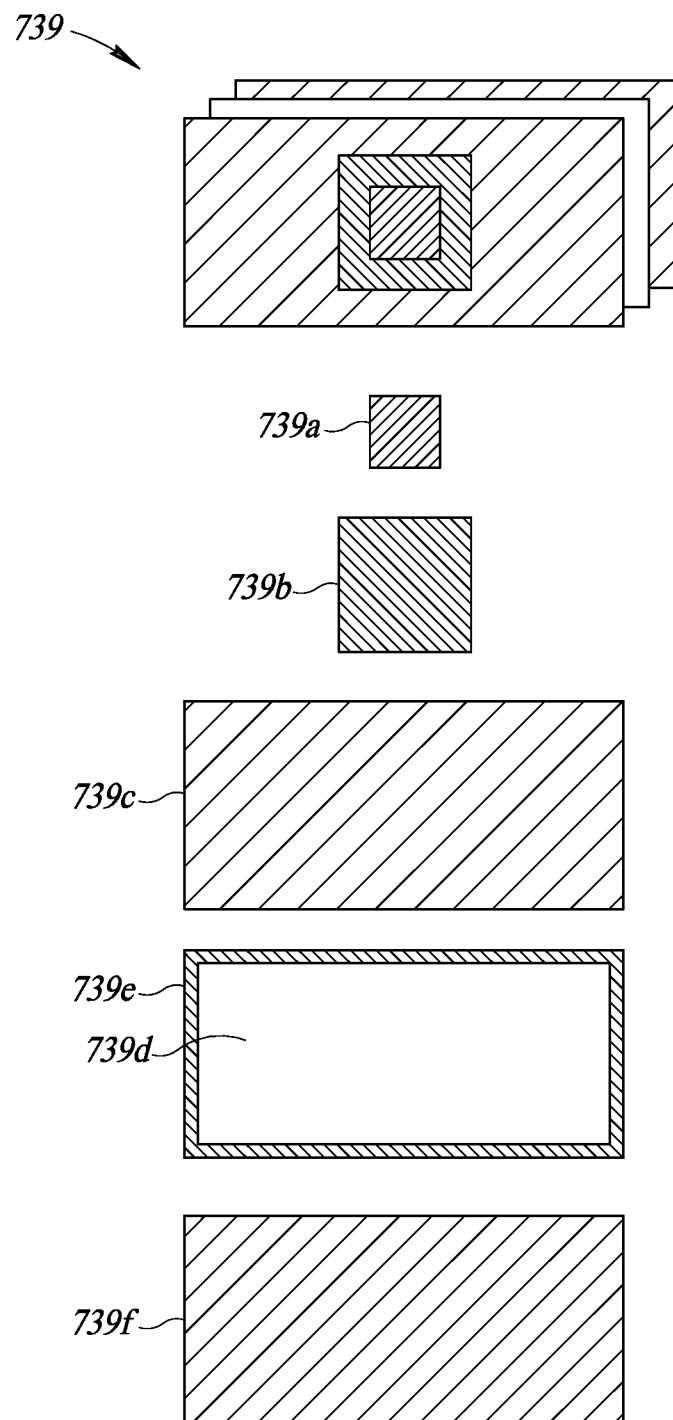
FIG. 13C shows an example sensor arrangement for the system of FIG. 7B, according to one illustrated implementation.

FIG. 13B shows an implementation which provides compensation for the impact that the reference voltage ($V_R$) has on the sensor 726 by using an inverted reference signal ($-V_R$) and an arrangement which couples the inverted reference signal to the sensor 726. FIG. 13C shows an example sensor arrangement which includes the inverted reference signal compensation.

In FIG. 13B, an adjustable inverting amplifier 741 is used to provide an inverted reference signal ($-V_R$) to the sensor 726 to compensate for the impact that the reference voltage ($+V_R$) has on the sensor. This may be achieved by a capacitive coupling ($C_C$) positioned proximate the sensor 726. The capacitive coupling ($C_C$) may be in the form of a wire, screen, shield, etc., positioned proximate the sensor. The compensation may be particularly advantageous when the insulated conductor 706 has a relatively small diameter because, in such instances, the reference voltage ($V_R$) from the reference shield 734 may have the greatest impact on the sensor 726.

FIG. 13C shows an example sensor arrangement 739 for use in an implementation which provides the aforementioned reference signal compensation. The sensor arrangement 739 includes a sensor 739a, an insulating layer 739b (e.g., Kapton® tape), an internal ground guard 739c, an inverted reference signal layer 739d ($-V_R$), an insulating layer 739e, and a reference signal layer 739f ($+V_R$).

Figure 16:
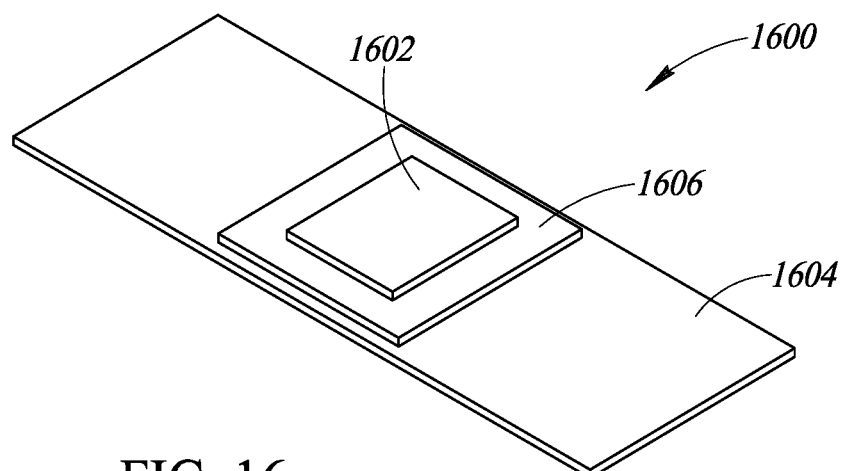
FIG. 16 is a perspective view of a sensor and internal ground guard assembly of a non-contact measurement system, according to one illustrated implementation.

FIG. 16 is a perspective view of an example sensor and guard assembly 1600 for a non-contact measurement system, such as any of the non-contact measurement systems discussed above. In this example, the sensor and guard assembly 1600 comprises a conductive sensor 1602, an internal ground guard 1604, and an isolating layer 1606 disposed between the sensor and the internal ground guard. Generally, the sensor assembly 1600 should provide good coupling capacitance ($C_O$) between the sensor 1602 and the wire under test and should suppress the capacitance to other adjacent wires and the capacitance to the external ground. The sensor assembly 1600 should also minimize the capacitance ($C_{SENS-REF}$) between the sensor 1602 and the reference shield (e.g., reference shield 734).

As a simple example, the sensor 1602, guard 1604 and isolating layer 1606 may each comprise a piece of foil. The guard 1604 may be coupled to a carrier (see FIG. 17), the isolating layer 1606 (e.g., Kapton® tape) may be coupled to the guard, and the sensor 1602 may be coupled to the isolating layer.

Figure 17:
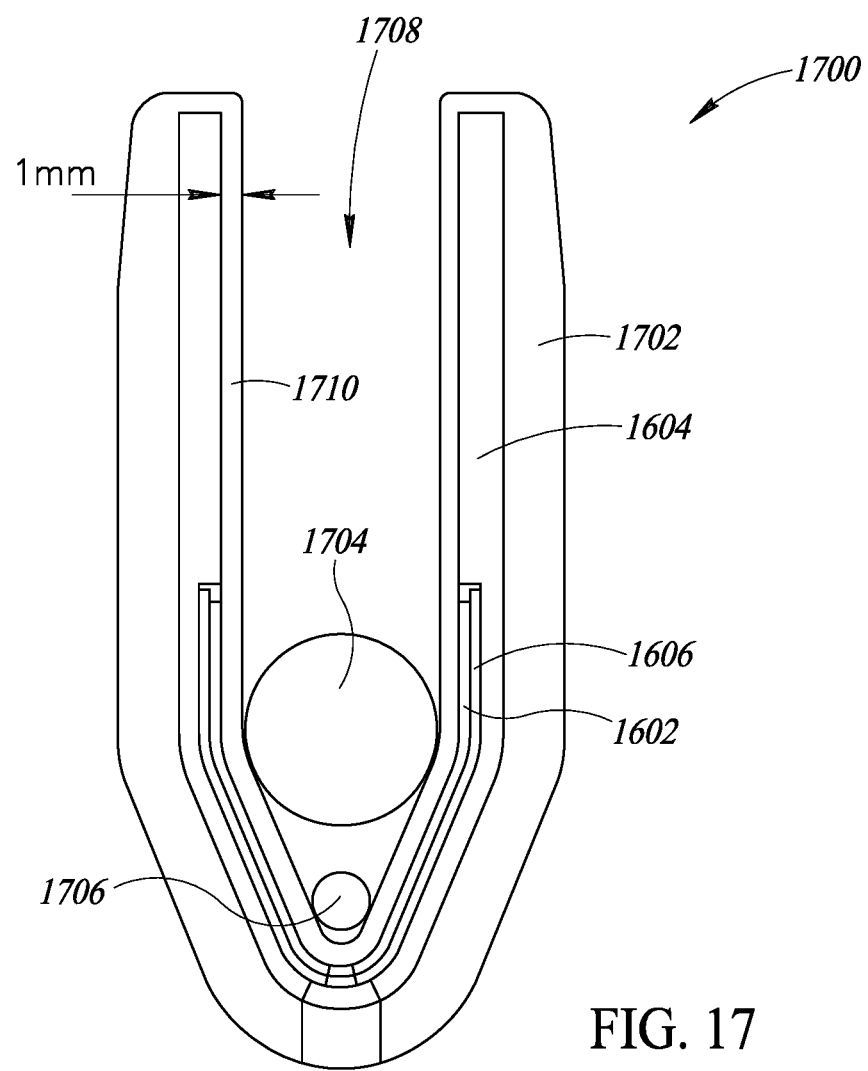
FIG. 17 is a sectional view of a "U" or "V" shaped sensor front end of a non-contact measurement system, according to one illustrated implementation.

FIG. 17 shows a sectional view of an example for a sensor realization of a probe or front end 1700 of a non-contact measurement system, which includes a housing layer 1702 (e.g., plastic) which covers the sensor assembly 1600 to avoid direct galvanic contact between the sensor assembly and any objects. The front end 1700 may be similar or identical to the front end 712 of the non-contact measurement system 702 shown in FIGS. 7A and 7B. In this illustration, the sensor assembly 1600, including the sensor 1602, guard 1604 and isolating layer 1606, are shaped in the form of a "U" or "V," to allow the sensor assembly 1600 to surround insulated wires of different diameters, to increase the coupling capacitance ($C_O$), and to better shield, by the guard, against adjacent conductive objects.

In the example shown in FIG. 17, the sensor assembly 1600 is shaped to accommodate insulated wires of various diameters, such as an insulated wire 1704 with a relatively large diameter or an insulated wire 1706 with a relatively small diameter. In each case, the sensor assembly 1600 substantially surrounds the wire when the wire is positioned in a recessed portion 1708 of the front end 1700. A wall of the front end 1700 which defines the recessed portion 1708 and is positioned between the sensor assembly 1600 and the wire under test may be relatively thin (e.g., 1 mm), to provide galvanic isolation while still allowing for suitable capacitive coupling. Due to the "V" shape of the recessed portion 1708, thicker wires 1704 have more distance than thinner ones 1706 to reduce the wide range of coupling capacitance and also to reduce the environmental capacitance to be less independent of wire diameter.

Figure 18:
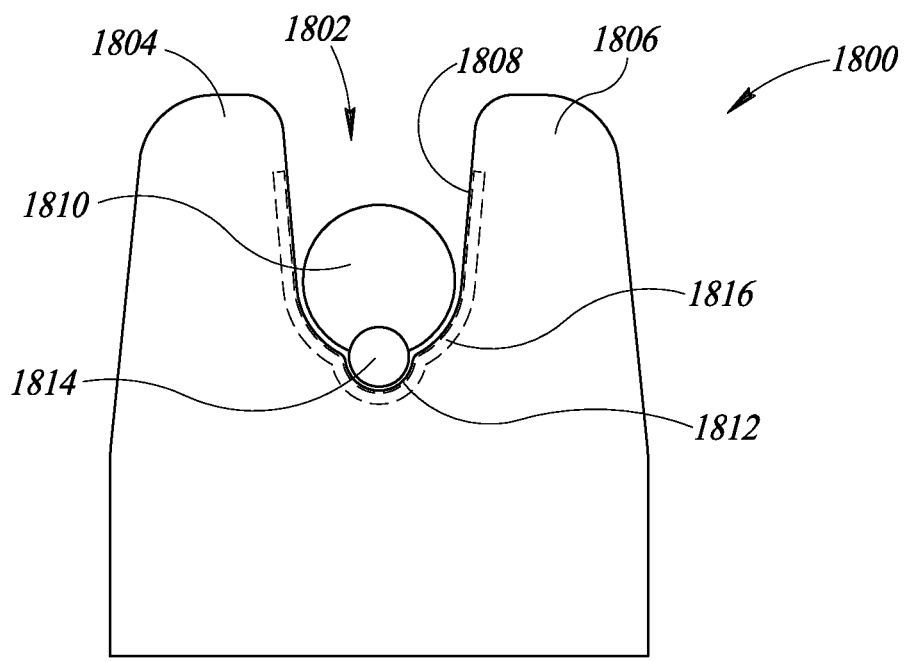
FIG. 18 is an elevational view of an arcuate-shaped sensor front end of a non-contact measurement system, according to one illustrated implementation.

FIG. 18 shows an elevational view of an arcuate-shaped front end 1800 of a non-contact measurement system. The front end 1800 includes a recessed portion 1802 defined by first and second extended portions 1804 and 1806. The recessed portion 1802 includes a relatively large upper arcuate-shaped portion 1808 which receives an insulated wire 1810 having a relatively large diameter. The recessed portion 1802 also includes a relatively small lower arcuate-shaped portion 1812, below the portion 1808, which receives an insulated wire 1814 having a relatively small diameter. A sensor assembly 1816, which may be similar to the sensor assembly 1600 shown in FIG. 16 and which is covered by the portions 1808 and 1812, may have a shape that substantially conforms to the arcuate-shaped portions 1808 and 1812 so that the sensor assembly 1816 substantially surrounds wires having a relatively large diameter (e.g., wire 1810) and wires having a relatively small diameter (e.g., wire 1814).

Figure 19:
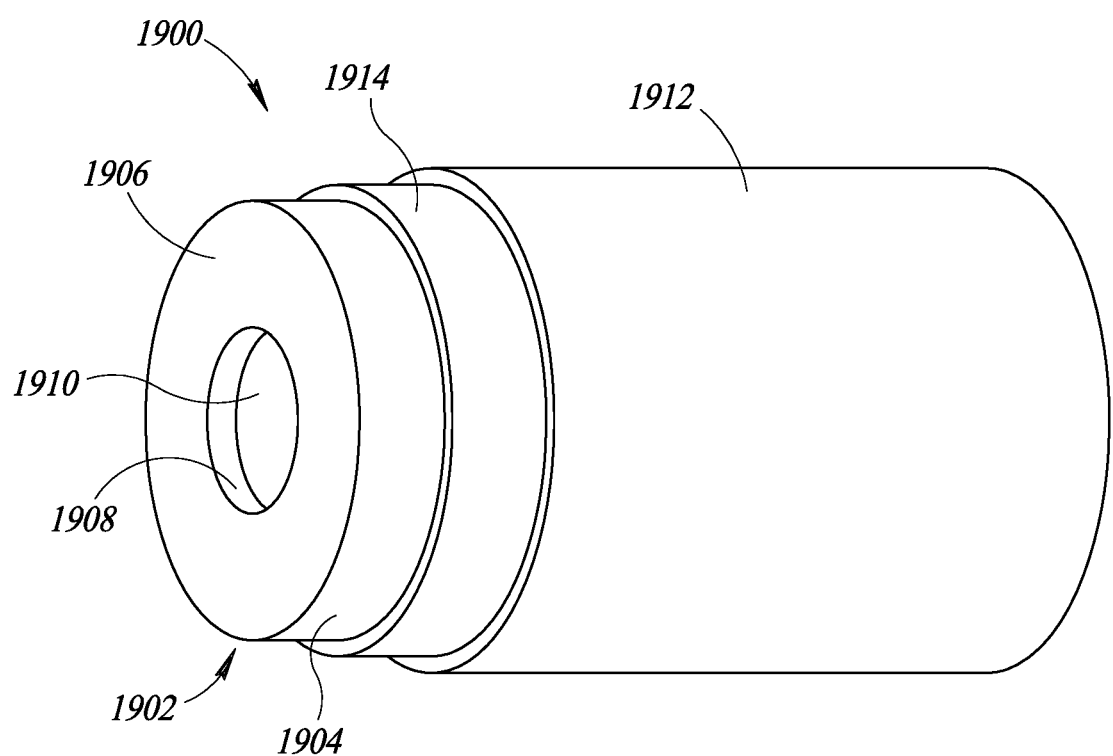
FIG. 19 is a perspective view of a cylindrically-shaped sensor front end of a non-contact measurement system, according to one illustrated implementation.

FIG. 19 is a perspective view of a cylindrically shaped front end 1900 of a non-contact measurement system. In this example, the front end 1900 includes a cylindrically shaped internal ground guard 1902 which has a sidewall 1904 and a front surface 1906 which may be positioned proximate a wire under test. The front surface 1906 of the internal ground guard 1902 includes a central opening 1908. A conductive sensor 1910, which forms the coupling capacitor ($C_O$) together with a wire under test, is recessed behind the opening 1908 of the internal ground guard 1902 to avoid capacitive coupling with adjacent objects. The sensor 1910 may be recessed by a distance (e.g., 3 mm) from the front surface 1906 of the internal ground guard 1902, for example.

The sidewall 1904 of the internal ground guard 1902 maybe surrounded by a cylindrically shaped reference shield 1912, which is isolated from the internal ground guard by an isolating layer 1914. A common mode reference voltage source (e.g., voltage source 730) may be connected between the internal guard ground 1902 and the reference shield 1912 to provide the functionality discussed above.

Figure 20A:
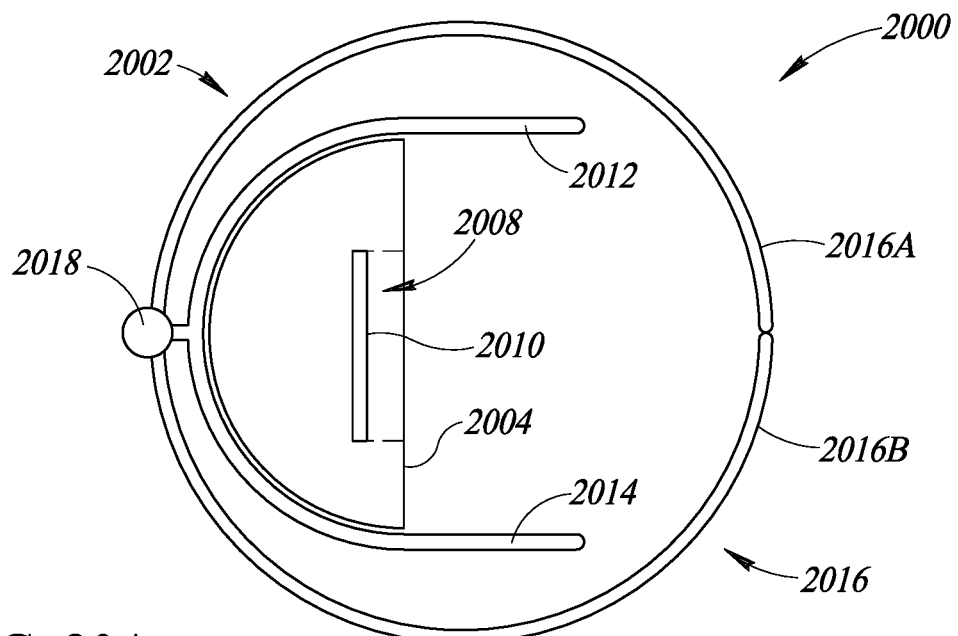
FIG. 20A is a top view of a sensor front end of a non-contact measurement system when a guard ring clamp of an internal ground guard is in a closed position, according to one illustrated implementation.
Figure 20B:
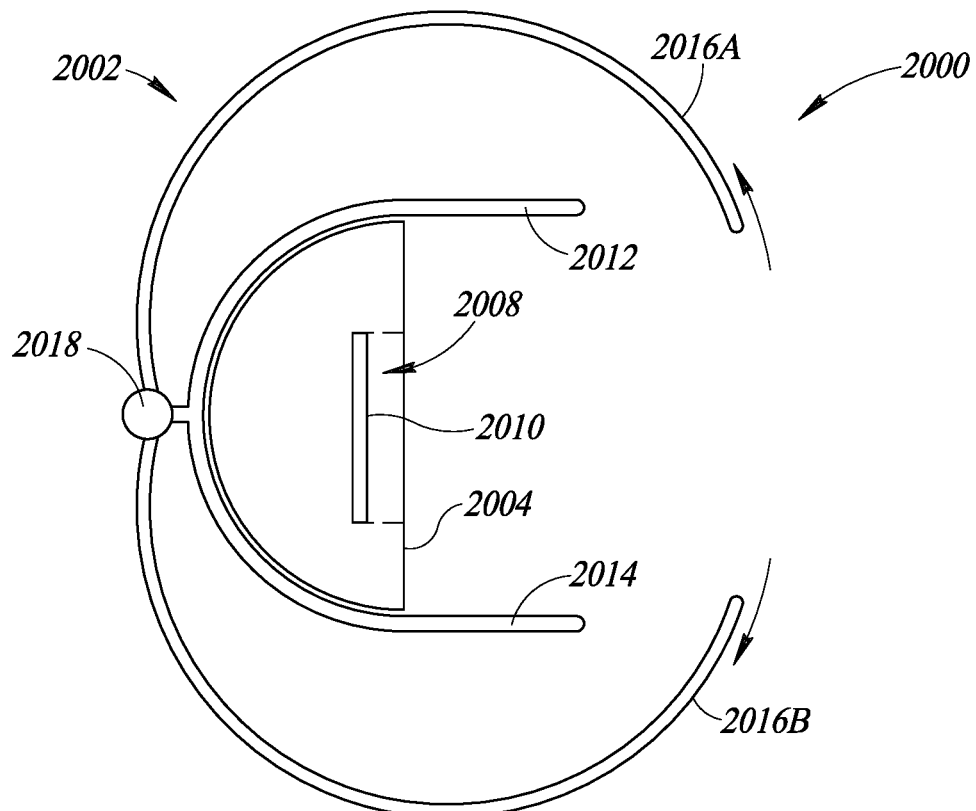
FIG. 20B is a top view of the front end of a non-contact measurement system shown in FIG. 20A when the guard ring clamp of the internal ground guard is in an opened position, according to one illustrated implementation.
Figure 21:
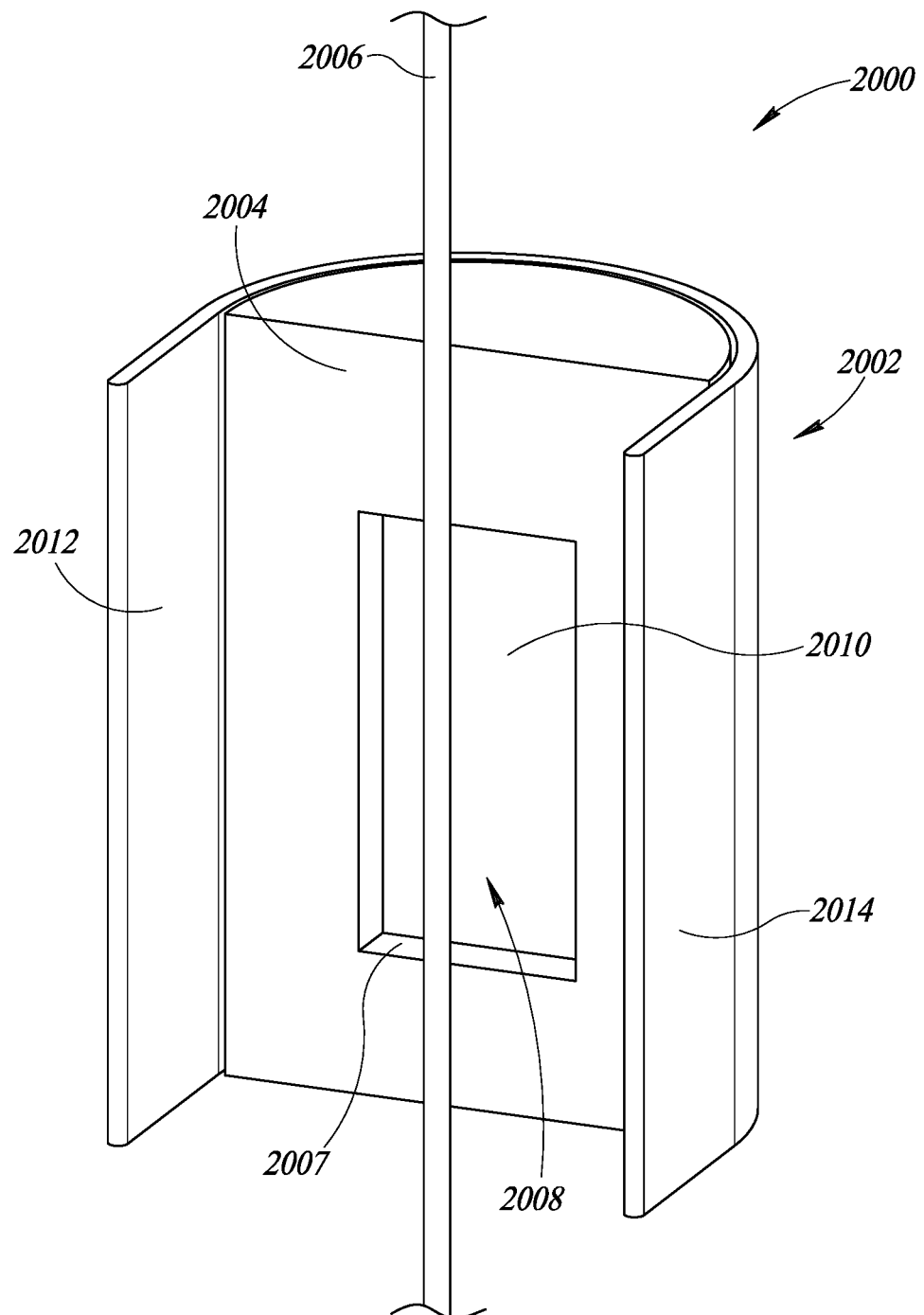
FIG. 21 is a perspective view of a portion of the sensor front end of FIG. 20A, with the guard ring clamp of the internal ground guard removed, according to one illustrated implementation.

FIGS. 20A and 20B show top views of a front end 2000 of a non-contact measurement system, and FIG. 21 shows a perspective view of a portion of the front end. In this example, the front end 2000 includes an internal ground guard 2002 which includes front surface 2004 against which a wire 2006 (FIG. 21) under test may be positioned. The front surface 2004 includes an edge 2007, in this case rectangular-shaped, which defines an opening 2008 in the front surface. This small long rectangular opening accommodates the wire shape having also a longer but thin shape seen from the side. This again reduces adjacent wire influence and also has a high reduction of environmental capacitance related to the sensor. This results in high accuracy independent of wire size. A conductive sensor 2010, which forms the coupling capacitor ($C_O$) with a wire under test, is recessed behind the opening 2008 of the front surface 2004 of the internal ground ground 2002 by a distance (e.g., 3 mm).

The internal ground guard 2002 also includes sidewalls 2012 and 2014 which extend forward (toward the wire under test) from lateral edges of the front surface 2004. The sidewalls reduce sensor stray capacitance and direct reference signal coupling. The internal ground guard 2002 may also include a conductive guard ring clamp 2016 which includes a first clamp arm 2016A and a second clamp arm 2016B. The clamp arms 2016A and 2016B may be selectively moved into an opened position, shown in FIG. 20B, to allow a wire under test to be positioned adjacent the front surface 2004 of the internal ground guard 2002. Once the wire is in position, the clamp arms 2016A and 2016B may be selectively moved into a closed position, shown in FIG. 20A, to provide a shield around the sensor 2010 from capacitances with the external environment (e.g., adjacent conductors, adjacent objects). When in the closed position, the guard ring clamp 2016 may be substantially in the shape of a cylinder which has a height that extends above and below the sensor 2010, for example. The clamp arms 2016A and 2016B may be selectively movable using any suitable manual or automated actuation subsystem 2018. For example, the clamp arms 2016A and 2016B may be biased toward the closed position (FIG. 20A) by a spring or other biasing mechanism which functions as the actuation system 2018, which bias may be overcome by an operator to move the clamp arms into the opened position (FIG. 20B) so that a wire under test may be positioned proximate the front surface 2004 of the internal ground guard 2002.

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one implementation, the present subject matter may be implemented via Application Specific Integrated Circuits (ASICs). However, those skilled in the art will recognize that the implementations disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

Those of skill in the art will recognize that many of the methods or algorithms set out herein may employ additional acts, may omit some acts, and/or may execute acts in a different order than specified. As an example, in at least some implementations a non-contact current measurement system may not utilize a processor to execute instructions. For example, a non-contact current measurement system may be hardwired to provide some or all of the functionality discussed herein. Additionally, in at least some implementations a non-contact current measurement system may not utilize a processor to cause or initiate the different functionality discussed herein.

In addition, those skilled in the art will appreciate that the mechanisms taught herein are capable of being distributed as a program product in a variety of forms, and that an illustrative implementation applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory.

The various implementations described above can be combined to provide further implementations. To the extent that it is not inconsistent with the specific teachings and definitions herein, U.S. Provisional Patent Application No. 62/421,124, filed Nov. 11, 2016; U.S. patent application Ser. No. 15/345,256, filed Nov. 7, 2016; U.S. patent application Ser. No. 15/413,025, filed Jan. 23, 2017; and U.S. patent application Ser. No. 15/412,891, filed Jan. 23, 2017, are incorporated herein by reference, in their entirety.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A non-contact current measurement system, comprising:
    a slider clamp assembly having a clamp member and a first clamp surface, the slider clamp assembly being adjustable to selectively clamp and locate an insulated wire at a defined position;
    a position feedback sensor that, in operation, senses an extension of the clamp member, determines a diameter of the insulated wire clamped in the slider clamp assembly, and generates a position feedback sensor signal indicative of the diameter of the insulated wire;
    a magnetic field sensor positioned proximate the slider clamp assembly, wherein in operation the magnetic field sensor detects a magnetic field generated by a current flowing in the insulated wire, and generates a magnetic field sensor signal that is indicative of at least one characteristic of the current flowing through the insulated wire clamped in the slider clamp assembly; and
    at least one processor communicatively coupled to the position feedback sensor and the magnetic field sensor, wherein in operation the at least one processor:
        receives the position feedback sensor signal from the position feedback sensor;
        determines a clamp position of the insulated wire clamped in the slider clamp assembly based on the position feedback sensor signal, wherein the clamp position is indicative of the diameter of the insulated wire;
        receives the magnetic field sensor signal from the magnetic field sensor; and
        determines at least one characteristic of the current flowing through the insulated wire based at least in part on the received position feedback sensor signal and the magnetic field sensor signal by accounting for an impact of the diameter of the insulated wire has on a relationship between the detected magnetic field and the current flowing in the wire, the at least one characteristic including at least one of a magnitude or frequency of the current flowing through the insulated wire.

2. The non-contact current measurement system of claim 1 wherein the position feedback sensor generates a linear position feedback signal indicative of a linear position of the slider clamp assembly.

3. The non-contact current measurement system of claim 1, further comprising a user interface operatively coupled to the at least one processor, wherein in operation the at least one processor causes the user interface to display the determined at least one characteristic of the current flowing through the insulated wire.

4. The non-contact current measurement system of claim 1 wherein the at least one characteristic of the current flowing through the insulated wire comprises a magnitude of the current flowing through the insulated wire.

5. The non-contact current measurement system of claim 1 wherein the position feedback sensor comprises a resistive sensor, a magneto-resistive sensor, a Hall Effect sensor, a capacitive sensor, an inductive sensor, or an optical sensor.

6. The non-contact current measurement system of claim 1 wherein the slider clamp assembly comprises a second clamp surface, the second clamp surface faces the first clamp surface, and at least one of the first and second clamp surfaces is movable in a direction toward and away from the other of the first and second clamp surfaces to selectively clamp the insulated wire between the first and second clamp surfaces at the defined position.

7. The non-contact current measurement system of claim 6 wherein the first clamp surface comprises a front end surface of a front end of a housing of the non-contact current measurement system, and the second clamp surface is disposed on a clamp member that is selectively movable with respect to front end surface.

8. The non-contact current measurement system of claim 7 wherein the magnetic field sensor is positioned proximate the front end surface of the front end of the housing.

9. The non-contact current measurement system of claim 1 wherein the clamp member is a first clamp portion and the slider clamp assembly comprises the first clamp portion having a first clamp surface and a second clamp portion having a second clamp surface that faces the first clamp surface, and a biasing member biases the first clamp portion toward the second clamp portion.

10. The non-contact current measurement system of claim 9 wherein at least one of the first clamp surface and the second clamp surface operates as a shield for the magnetic field sensor.

11. The non-contact current measurement system of claim 1, further comprising:
    a reference signal type sensor that, in operation, senses a reference signal in the insulated wire without galvanically contacting the insulated wire,
    wherein the at least one processor receives the reference signal and determines the at least one characteristic of the current flowing through the insulated wire based at least in part on the received reference signal.

12. The non-contact current measurement system of claim 11 wherein the at least one processor further determines at least one physical dimension of a conductor inside the insulated wire based at least in part on the received reference signal, wherein the at least one physical dimension is indicative of a distance between the conductor and the magnetic field sensor.

13. The non-contact current measurement system of claim 11 wherein the at least one processor further determines at least one physical dimension of a conductor inside the insulated wire based at least in part on the received reference signal and the received position feedback sensor signal.

14. A method of measuring current in an insulated wire without galvanically contacting a conductor in the insulated wire, the method comprising:
    clamping, via slider clamp assembly, the insulated wire between first and second clamp surfaces;
    determining a clamp distance between the first and second clamp surfaces, wherein the clamp distance is indicative of a diameter of the insulated wire clamped between the first and second clamp surfaces;

sensing, via a magnetic field sensor positioned proximate the insulated wire clamped between the first and second clamp surfaces, a magnetic field generated by the current flowing through the insulated wire, the magnetic field being indicative of at least one characteristic of the current flowing through the insulated wire; and determining, via at least one processor, at least one characteristic of the current flowing through the insulated wire based at least in part on the determined clamp distance and the sensed magnetic field generated by the current flowing through the insulated wire by accounting for an impact of the diameter of the insulated wire has on a relationship between the detected magnetic field and the current flowing in the wire, the at least one characteristic including at least one of a magnitude or frequency of the current flowing through the insulated wire.

15. The method of claim 14 wherein determining the clamp distance comprises determining a linear position of the slider clamp assembly.

16. The method of claim 14 wherein the first clamp surface is positioned on a first clamp portion and the second clamp surface is positioned on a second clamp portion, and the method further comprises biasing the first clamp portion toward the second clamp portion.

17. The method of claim 14, further comprising:
displaying, via a user interface, the determined at least one characteristic of the current flowing through the insulated wire.

18. The method of claim 14 wherein determining the at least one characteristic of the current flowing through the insulated wire comprises determining a magnitude of the current flowing through the insulated wire.

19. The method of claim 14 wherein the first clamp surface comprises a front end surface of a front end of a housing and the second clamp surface comprises a surface of a clamp member of the slider clamp assembly that is movable with respect to the front end surface, and clamping the insulated wire between the first and second clamp surfaces comprises clamping the insulated wire between the front end surface and the surface of the clamp member.

20. The method of claim 19 wherein sensing the magnetic field generated by the current flowing through the insulated wire comprises sensing the magnetic field via the magnetic field sensor, and the magnetic field sensor is positioned proximate the front end surface of the front end of the housing.

21. The method of claim 14, further comprising:
sensing, via a reference signal type sensor positioned in a housing, a reference signal in the insulated wire without galvanically contacting the insulated wire; and
determining, via the at least one processor, the at least one characteristic of the current flowing through the insulated wire based at least in part on the sensed reference signal.

22. The method of claim 21, further comprising:
determining, via the at least one processor, at least one physical dimension of a conductor inside the insulated wire based at least in part on the received reference signal.

23. The method of claim 21, further comprising:
determining, via the at least one processor, at least one physical dimension of a conductor inside the insulated wire based at least in part on the received reference signal and the determined clamp distance.

24. A non-contact current measurement system, comprising:
a housing comprising a front end portion having a front end surface;
a clamp member having a clamp member surface that faces the front end surface, wherein the clamp member is extendable with respect to the front end surface to selectively clamp an insulated wire between the front end surface and the clamp member surface;
a position feedback sensor that senses an extension of the clamp member, determines a diameter of the insulated wire clamped between the front end surface and the clamp member surface, and generates a position feedback sensor signal that is indicative of the diameter of the insulated wire;
a current sensor positioned proximate the front end surface of the housing, wherein in operation the current sensor generates a current sensor signal that is indicative of at least one characteristic of a current flowing through the insulated wire clamped between the front end surface and the clamp member surface; and
at least one processor communicatively coupled to the position feedback sensor and the current sensor, wherein in operation the at least one processor:
receives the position feedback sensor signal from the position feedback sensor;
determines a clamp position of the insulated wire clamped between the front end surface and the clamp member surface based on the position feedback sensor signal, wherein the clamp position is indicative of the diameter of the insulated wire;
receives the current sensor signal from the current sensor; and
determines at least one characteristic of the current flowing through the insulated wire based at least in part on the received position feedback signal and the current sensor signal by accounting for an impact of the diameter of the insulated wire has on a relationship between the current sensor signal generated by the current sensor and the current flowing in the wire, the at least one characteristic including at least one of a magnitude or frequency of the current flowing through the insulated wire.

25. The non-contact current measurement system of claim 24 wherein the current sensor comprises a magnetic field sensor.

26. The non-contact current measurement system of claim 24, further comprising a display operatively coupled to the at least one processor, wherein in operation the at least one processor causes the display to present a magnitude of the current flowing through the insulated wire.

27. The non-contact current measurement system of claim 24 wherein the position feedback sensor comprises a resistive sensor, a magneto-resistive sensor, a Hall Effect sensor, or an optical sensor.

* * * * *